United States Patent
Deshpande et al.

(10) Patent No.: US 10,638,013 B2
(45) Date of Patent: Apr. 28, 2020

(54) AUTOMATED WAVELET-BASED DATA COMPRESSION SYSTEMS AND METHODS

(71) Applicant: Chevron U.S.A. Inc., San Ramon, CA (US)

(72) Inventors: Alisha Deshpande, Los Angeles, CA (US); Lisa Ann Brenskelle, Houston, TX (US)

(73) Assignee: Chevron U.S.A. Inc., San Ramon, CA (US)

(*) Notice: Subject to any disclaimer, the term of this patent is extended or adjusted under 35 U.S.C. 154(b) by 24 days.

(21) Appl. No.: 15/618,753

(22) Filed: Jun. 9, 2017

(65) Prior Publication Data

US 2017/0359478 A1    Dec. 14, 2017

Related U.S. Application Data

(60) Provisional application No. 62/348,023, filed on Jun. 9, 2016.

(51) Int. Cl.
*H04N 1/32* (2006.01)
*H03M 7/30* (2006.01)
(Continued)

(52) U.S. Cl.
CPC .......... *H04N 1/3217* (2013.01); *G06T 9/00* (2013.01); *G11B 20/00007* (2013.01);
(Continued)

(58) Field of Classification Search
CPC ........ H04N 1/3217; H04N 19/00; H04N 1/41; G06T 9/00; H03M 7/3064; H03M 7/3059; G11B 20/00007; H04L 27/0004
See application file for complete search history.

(56) References Cited

U.S. PATENT DOCUMENTS 5,419,299 A * 5/1995 Fukasawa .......... F02M 25/0809
                                                  123/520
6,215,907 B1 * 4/2001 Kumar .................... H03M 7/30
                                                  375/E7.048
(Continued)

FOREIGN PATENT DOCUMENTS

EP          2618269 A1 *  7/2013  ........... G06F 17/148
WO    WO-2017019030 A1 *  2/2017  ........... H03M 7/4031

OTHER PUBLICATIONS

Manish M., S.J. Qin, S. Kumar, and D. Seeman "On-line Data Compression and Error Analysis Using Wavelet Technology", AIChE Journal, vol. 46, No. 1, Jan. 2000 (Year: 2000).*
(Continued)

*Primary Examiner* — Richard A Hansell, Jr.
(74) *Attorney, Agent, or Firm* — William N. Hughet; E. Joseph Gess; Melissa M. Hayworth

(57) ABSTRACT

Systems and methods for processing online data are disclosed. One such method includes receiving a plurality of data points in a time-series at a short term storage. The method also includes calculating at least one approximation coefficient based on the plurality of data points using a wavelet transform, including calculating a highest level approximation coefficient, and calculating estimated value based on the highest level approximation coefficient. The method further includes calculating differences between the estimated value and the plurality of data points of the short term storage, and determining whether a maximum difference among the calculated differences is less than a predetermined threshold. The method further includes, based on the maximum difference being greater than or equal to the predetermined threshold, storing the oldest data point of the short term storage in a long term storage.

17 Claims, 14 Drawing Sheets

(51) Int. Cl.
    G11B 20/00      (2006.01)
    H04N 1/41       (2006.01)
    H04N 19/00      (2014.01)
    G06T 9/00       (2006.01)
    H04L 27/00      (2006.01)
(52) U.S. Cl.
    CPC ....... *H03M 7/3059* (2013.01); *H03M 7/3064* (2013.01); *H04N 1/41* (2013.01); *H04N 19/00* (2013.01); *H04L 27/0004* (2013.01)

(56) References Cited

U.S. PATENT DOCUMENTS

| | | | | |
|---|---|---|---|---|
| 8,554,746 | B2 * | 10/2013 | Weinberger | H03M 7/3064 707/693 |
| 8,664,746 | B2 * | 3/2014 | Korycinski | H01L 21/76281 257/617 |
| 2004/0027259 | A1 * | 2/2004 | Soliman | G06T 9/40 341/50 |
| 2017/0167247 | A1 * | 6/2017 | Gao | E21B 49/00 |

OTHER PUBLICATIONS

Manish M., S.J. Qin, S. Kumar, and D. Seeman "On-line Data Compression and Error Analysis Using Wavelet Technology", AIChE Journal, vol. 46, No. 1, Jan. 2000 (Year: 2000) (Year: 2000).*
Deshpande, A., et al., "Automated Real-Time Process Data Analysis Using Online Wavelet Transforms: Fault Detection, Data Cleansing and Compression", SPE-181089-MS, Presentation at the SPE Intelligent Energy International Conference and Exhibition, Aberdeen UK Sep. 6-8, 2016.
Mallat, Stephane G., "A Theory for Multiresolution Signal Decomposition: The Wavelet Representation", IEEE Transactions on Pattern Analysis and Machine Intelligence 1989 11(7):674-693.
Cohen, Rami, "Signal Denoising Using Wavelets", Project Report, Technion, Israel Institute of Technology, 2012.
Misra, Manish and S. Joe Qin, "On-Line Data Compression and Error Analysis Using Wavelet Technology", AIChI Journal 2000 46(1):119-132.

* cited by examiner

AUTOMATED WAVELET-BASED DATA COMPRESSION SYSTEMS AND METHODS

CROSS-REFERENCE TO RELATED APPLICATIONS

The present application claims priority from U.S. Provisional Application No. 62/348,023, filed on Jun. 9, 2016, the disclosure of which is hereby incorporated by reference in its entirety.

TECHNICAL FIELD

The present disclosure relates generally to the field of data compression. In particular, the present disclosure relates to automated wavelet-based data compression systems and methods.

BACKGROUND

Monitoring systems for online environments generally track characteristics of a particular operating system or process, and generate data describing a characteristic of the operating system or process. For example, a sensor may sense a characteristic of an operating process and generate a reading every second, or many times a second. Such data will then generally be stored for subsequent analysis. This generally results in large amounts of data to be stored and analyzed, which can be time-consuming and inefficient. Accordingly, it is desirable to compress such data for storage and to reduce storage capacity. In addition, very small measurement changes (e.g., measurement noise or repeated values) may not be meaningful and are not needed in long-term storage.

Such types of monitoring systems are particularly applicable in large industrial systems for which monitoring of changes in an industrial process can be important. In such cases, compression of data may be required due to the sheer amount of data collected, while preservation of features in the compressed data is also generally important, because it allows analysis to understand and improve the industrial process.

There are currently several methods to compress process data in an online environment. The two most common methods are the boxcar method and the swinging door method. Both methods have drawbacks. For example, both methods require substantial user input at set-up time to select specific data compression parameters to be applied during a compression operation. Even with such user input, these methods have relatively low levels of compression (e.g., as low as 20-30%). In some circumstances, these existing methods may apply a common set of compression parameters across an entire data stream, comprised of different types of measurements, which may result in over- or under-compression.

Other existing systems will operate based on pre-stored data to perform data compression in a "batch" mode. Such systems, by their very nature, require substantial storage resources to allow for storage of pre-compressed data, and also introduce delay between a time when data is received from a sensor or tag, and a time when compressed data is available for analysis. Other solutions, although real-time in compression, may require later reconstruction of data for analysis, introducing an extra step.

Therefore, a need exists in the art for an improved manner of performing data compression.

SUMMARY

In accordance with the present disclosure, the above and other problems are solved by providing systems and methods for automatic online data compression using wavelet transforms. Such transforms provide improved compression while preserving features in data, among other advantages described herein.

In a first aspect, a system for processing time-series data is disclosed. The system includes a processor and a memory communicatively connected to the processor. The memory includes a short term storage and a long term storage. The memory stores computer-executable instructions which, when executed, cause the processor to perform: receiving a plurality of data points in a time-series at the short term storage; calculating at least one approximation coefficient based on the plurality of data points using a wavelet transform, including calculating a highest level approximation coefficient; calculating estimated value based on the highest level approximation coefficient; calculating differences between the estimated value and the plurality of data points of the short term storage; determining whether a maximum difference among the calculated differences is less than a predetermined threshold; and based on the maximum difference being greater than or equal to the predetermined threshold, storing the oldest data point of the short term storage in the long term storage.

In a second aspect, a computer-implemented method of compressing data is disclosed. The method includes receiving a plurality of data points in a time-series at a short term storage; calculating at least one approximation coefficient based on the plurality of data points using a wavelet transform, including calculating a highest level approximation coefficient; calculating estimated value based on the highest level approximation coefficient; calculating differences between the estimated value and the plurality of data points of the short term storage; determining whether a maximum difference among the calculated differences is less than a predetermined threshold; and based on the maximum difference being greater than or equal to the predetermined threshold, storing the oldest data point of the short term storage in a long term storage.

In a third aspect, a system for processing time-series data generated by a hydrocarbon production facility is disclosed. The system includes a processor and a memory communicatively connected to the processor. The memory includes a short term storage and a long term storage. The memory stores computer-executable instructions which, when executed, cause the processor to perform: receiving a selection of a data tag associated with a data stream including a plurality of data points in a time-series, wherein the data tag is associated with a sensor in a hydrocarbon production facility; calculating at least one approximation coefficient based on the plurality of data points using a wavelet transform, including calculating a highest level approximation coefficient; calculating estimated value based on the highest level approximation coefficient; calculating differences between the estimated value and the plurality of data points of the short term storage; determining whether a maximum difference among the calculated differences is less than a predetermined threshold; and based on the maximum difference being greater than or equal to the predetermined threshold, storing the oldest data point of the short term storage in the long term storage. The predetermined threshold is based on accuracy of the sensor This summary is provided to introduce a selection of concepts in a simplified form that are further described below in the Detailed Description. This summary is not intended to identify key features or essential features of the claimed subject matter, nor is it intended to be used to limit the scope of the claimed subject matter.

DETAILED DESCRIPTION

Figure 1A:
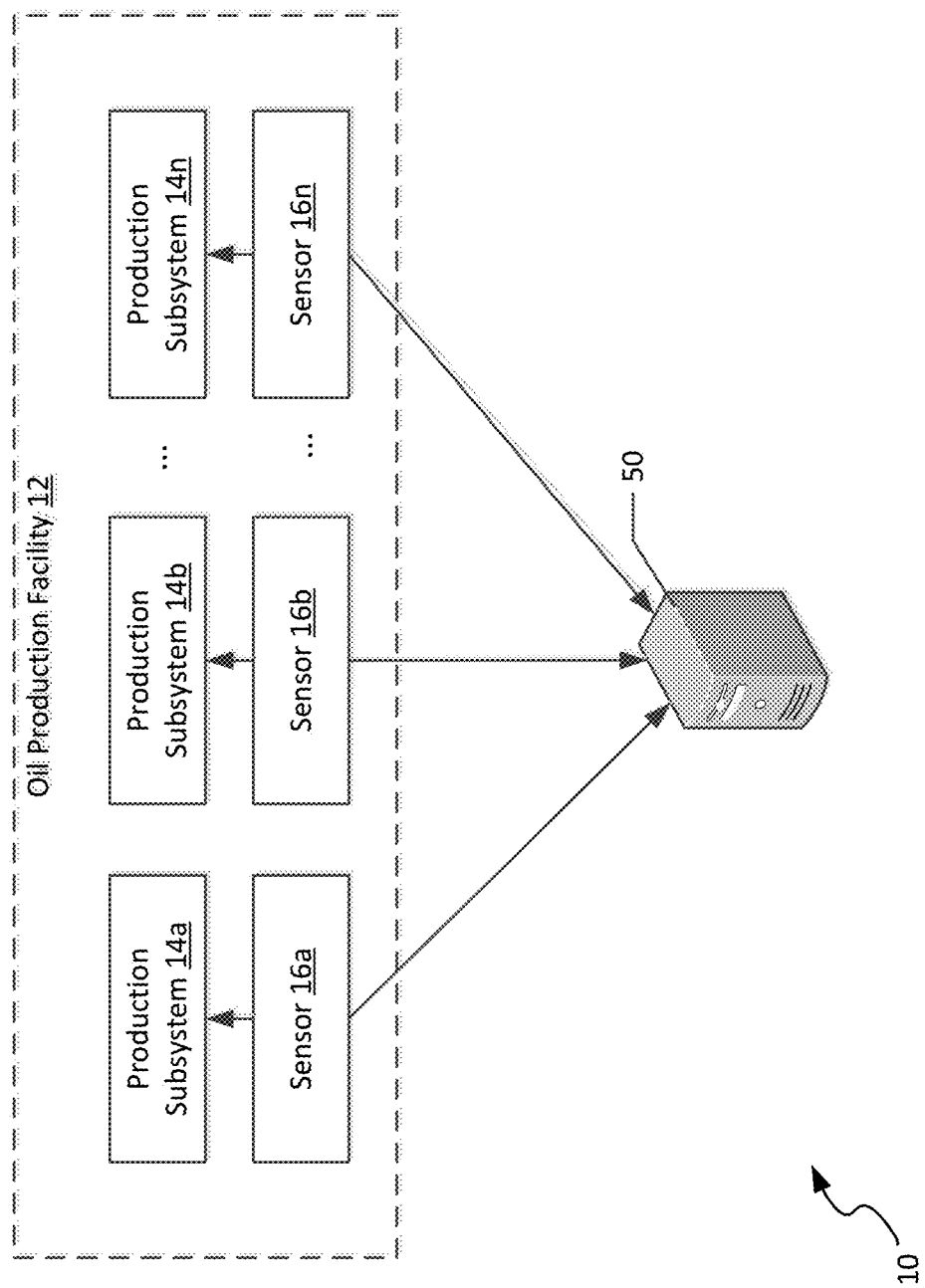
FIGS. 1A-1B illustrates an example system in which automated data compression may be performed.

The following terms will be used throughout the specification and will have the following meanings unless otherwise indicated. "Tag" or "data tag" may refer to a single time-series data source (e.g., sensor, data archive, database, spreadsheet, or other source of data), and it is sometimes referred to as "measurement". "Data stream" may correspond to one or more tags. "Data point" may refer to a single value in time of a tag. However, those of ordinary skill in the art will appreciate that data stream and data point may not be associated with any tags in some embodiments (e.g., embodiments that are outside of the hydrocarbon production industry), and the inventive concepts may nonetheless be used for compression in these embodiments. Also, in some embodiments, "sensor accuracy" is a function of the range of the sensor (aka sensor range). Also, those ordinary skill in the art will appreciate that the embodiments provided herein may be utilized to process and/or compress practically any time series data, including but not limited to, online data such as real-time data, batch of stored data (i.e., batch data), etc.

As briefly described above, embodiments of the present invention are directed to systems and methods for performing a wavelet transform-based data compression method. The methods and systems described herein for data compression are particularly applicable to streaming data, such as high volume time-series data that may be obtained from sensors or other data sources. Example applications of embodiments of the present disclosure find use in the context of industrial processes, such as in the case of hydrocarbon production facilities, in which many different subsystems may need to be monitored, leading to large amounts of collected data. Furthermore, embodiments described herein can be applied to realtime data streams, and can be used to determine whether specific data included in a data stream is to be stored or discarded. In a particular embodiment, such an arrangement is used in connection with management of process data in oil facilities, for example in a plant information management system environment, such as the environment provided by OSIsoft of San Leandro, Calif. However, numerous other applications are possible as well, and this specification is not limited to the hydrocarbon industry.

One further possible application of the present disclosure is in the context of seismic data. Seismic data may be generated by sending sound waves through the Earth via at least one source (e.g., airgun, vibroseis, etc.) and recording the arrival of the sound waves with at least one receiver (e.g., hydrophone, geophone, etc.). Seismic data is processed to create digital seismic images that can be interpreted to identify subsurface geologic features including hydrocarbon deposits. The ability to define the location of rock and fluid properties as well as temperature and pressure conditions in the subsurface are useful in making appropriate choices for well design, purchasing materials, operating safely, and successfully completing projects. Project cost is dependent upon accurate prediction of the position of physical boundaries within the Earth. Decisions include, but are not limited to, budgetary planning, obtaining mineral and lease rights, signing well commitments, permitting rig locations, designing well paths and drilling strategy, preventing subsurface integrity issues by planning proper casing and cementation strategies, and selecting and purchasing appropriate completion and production equipment. Good quality seismic velocities typically result in better digital seismic images as well as more accurate pore pressure predictions, which is critical for many applications such as well design, reservoir and seal quality prediction, identification of potential geo-hazards, and subsurface integrity studies. Accordingly, careful compression of seismic data is important for purposes of maintaining reliable data describing subsurface geologic features accurately.

In the various embodiments discussed herein, the methods and systems described herein are specifically effective as working on each tag individually and uniquely, with relatively low error when compared to original data. As compared to existing algorithms, the systems and methods described herein provide increased efficiency and flexibility of use, as they use a sensor type to set a threshold (e.g., based on accuracy of the sensor type), which automatically determines a compression level for each tag of that sensor type. Furthermore, the methods described herein provide automated real-time or near real-time data compression, with the decision to keep or remove data points integrated in the systems and methods described herein. Still further, the present methods and systems are at least partially automated, and in some cases fully automated (after set-up of a limited set of parameters), providing reduced requirements for decision-making by a user in advance of compression. In addition, compression ratios are very high compared to existing commercial solutions. Furthermore, compression error (error between an original data set and a compressed data set wherein non-archived data is regenerated with original time steps) is improved compared to existing commercial methods. Additionally, the methods and systems described herein compress each unique tag separately while setting thresholds for each tag based on its sensor type, eliminating the tedious step of inputting compression parameters for each tag. Furthermore, such systems take advantage of the fact that data points are received in time-series and thereby avoid indexing received data. Finally, while other compression algorithms may change the form of the data and require a reconstruction step to re-generate the original data—aspects of the present disclosure use the wavelet transform in decision-making but retain the data in its original form.

Additionally, the present methods and systems are used on a per-tag basis meaning that each time-series of data points is independently considered for purposes of compression. Furthermore, because each tag may be associated with a different type of sensor having a different accuracy, a knowledge of tag type can be used to set a compression threshold based on sensor type. Additionally, if sensor type is unknown, then, a general threshold could be used.

The methods provided herein also improve the functioning of one or more computing system. For example, as evident from the examples provided herein, the data compression can be performed more accurately (e.g., lower compression error), faster, and with fewer storage requirements as compared to existing commercial options.

FIG. 1A illustrates an example system in which automated data compression may be performed, according to the example embodiments discussed herein. In the embodiment shown, the system 10 can be associated with a hydrocarbon production facility 12, such as an oil production plant, at which a plurality of subsystems, e.g., production subsystems 14a, 14b, 14n such as plant equipment, can be operated to produce useable hydrocarbon products. In the embodiment shown, one or more of the plant subsystems may be associated with sensors 16a, 16b, 16n, each of which may monitor a different subsystem, or different characteristic of the same subsystem. For example, the sensors can include pressure sensors, temperature sensors, optical sensors, electrical sensors, and the like.

In the embodiment shown, the sensors 16 are communicatively connected to a computing system 50. Although illustrated, in this example, as being external to the hydrocarbon production facility 12, it is noted that the computing system 50 may be physically located at the hydrocarbon production facility as well (e.g., communicatively connected via a communication network).

In general, one or more of the sensors may periodically obtain readings of specific types from the subsystems 14 at the hydrocarbon production facility 12. Such readings may, for example, include data that is captured at a sensor, timestamped, and provided to the computing system 50 (or, the computing system 50 may itself timestamp sensor readings prior to compression). Because such hydrocarbon production facilities tend to have large numbers of subsystems with large numbers of sensors, and because data is obtained from sensors frequently (due to sensitive and variable conditions of a number of subsystems), large amounts of data are often obtained.

The computing system 50 is configured to receive at least some of the data obtained from sensors 16a-n for processing and analysis. In some example embodiments, the computing system 50 can be operating a plant information management system environment, such as the environment provided by OSIsoft of San Leandro, Calif. In another embodiment, the computing system 50 may represent all or part of a control system for a corresponding industrial process, such as a control system like Yokogawa Centrum VP provided by Yokogawa Corporation of Japan. Other types of plant information management systems could be used as well. However, generally the computing system 50 aggregates data and monitors operation, and as such represents a computing system at which data processing is performed, and at which compression of data may be desirable.

Figure 1B:
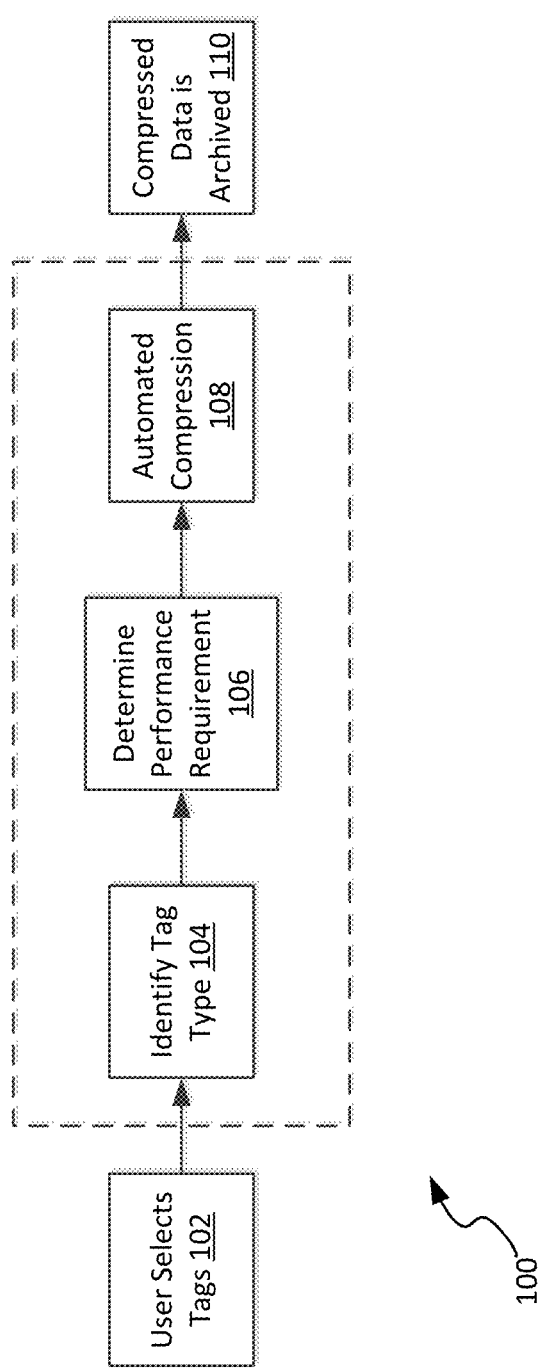

FIG. 1B illustrates an example system 100 in which automated data compression may be performed. The system 100, compared to system 10, represents a general arrangement in which a system can be implemented, rather than in the specific context of a hydrocarbon production facility. In the example shown, one or more user-selected data tags are selected for compression. In the embodiment shown, a user first selects one or more tags to be compressed in operation 102. Selected tags are passed to the system 100, which includes a tag type identifier 104, a performance threshold determination 106, and an automated compression 108.

Figure 2:
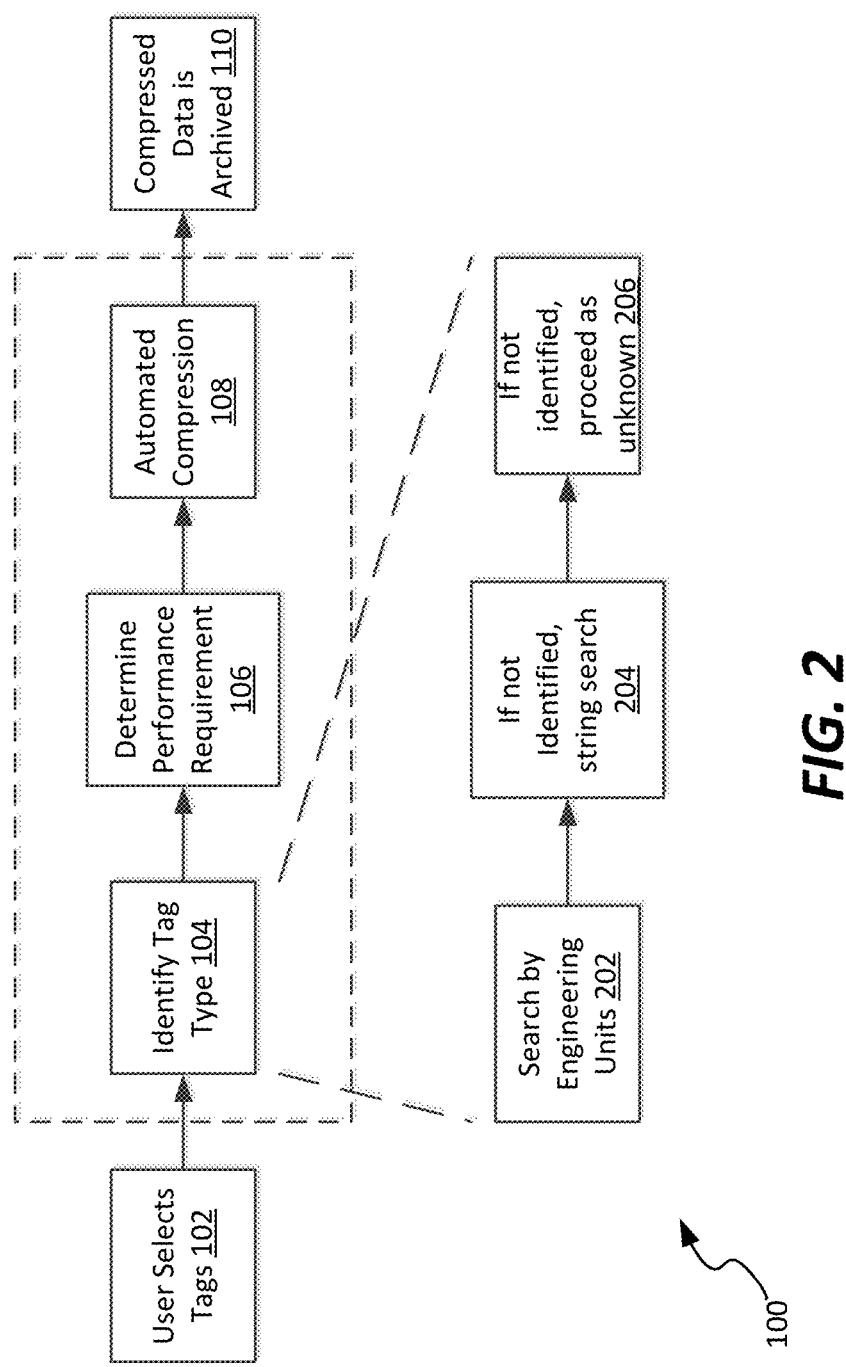
FIG. 2 illustrates an example embodiment of identification of tag types in the example system of FIGS. 1A-1B.

The tag type identifier 104 generally identifies the sensor type with which tags are associated. One example providing additional details regarding a tag type identifier is depicted in FIG. 2. In that embodiment, the tag type identifier 104 can identify a tag type for a particular tag by performing a search by engineering units (at operation 202). If such a search does not identify the tag type, a string search is next performed (at operation 204). If the string search also cannot identify a tag type, the system 100 will proceed as though the tag type is unknown (at operation 206). In alternative embodiments, other ways of determining a tag type could be applied, or other orders of search for engineering units, strings, or other types of data identification could be used. In addition, the identification of tag types could be used as a first operation, after which the user selects tags to which to apply a pre-determined threshold.

Figure 3:
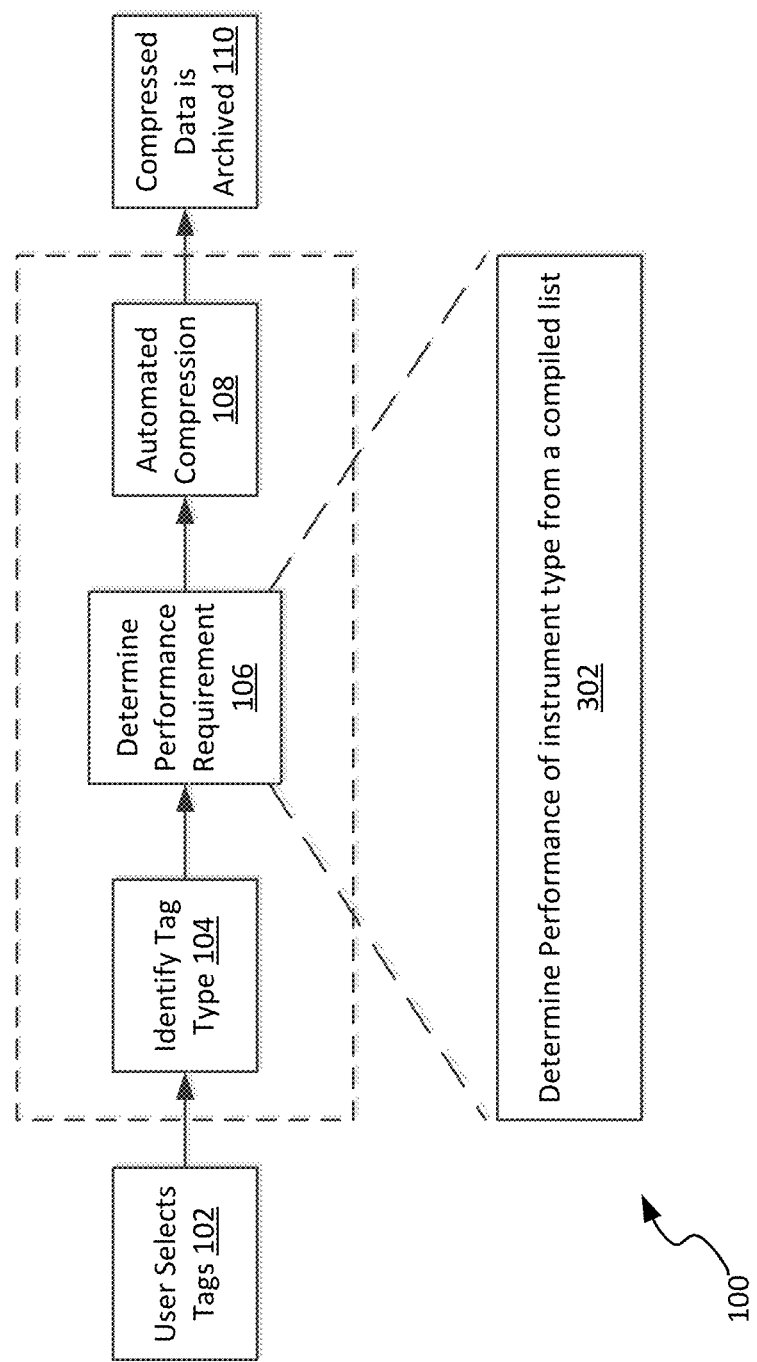
FIG. 3 illustrates an example embodiment of determination of performance thresholds in the example system of FIGS. 1A-1B.

As seen in FIG. 3, the performance threshold determination 106 can be accomplished, for example by assessing a desired performance based on sensor type from a compiled list of sensor types (at operation 302). For example, certain sensor types may have different accuracies and therefore different thresholds to be used in compression.

Figure 4:
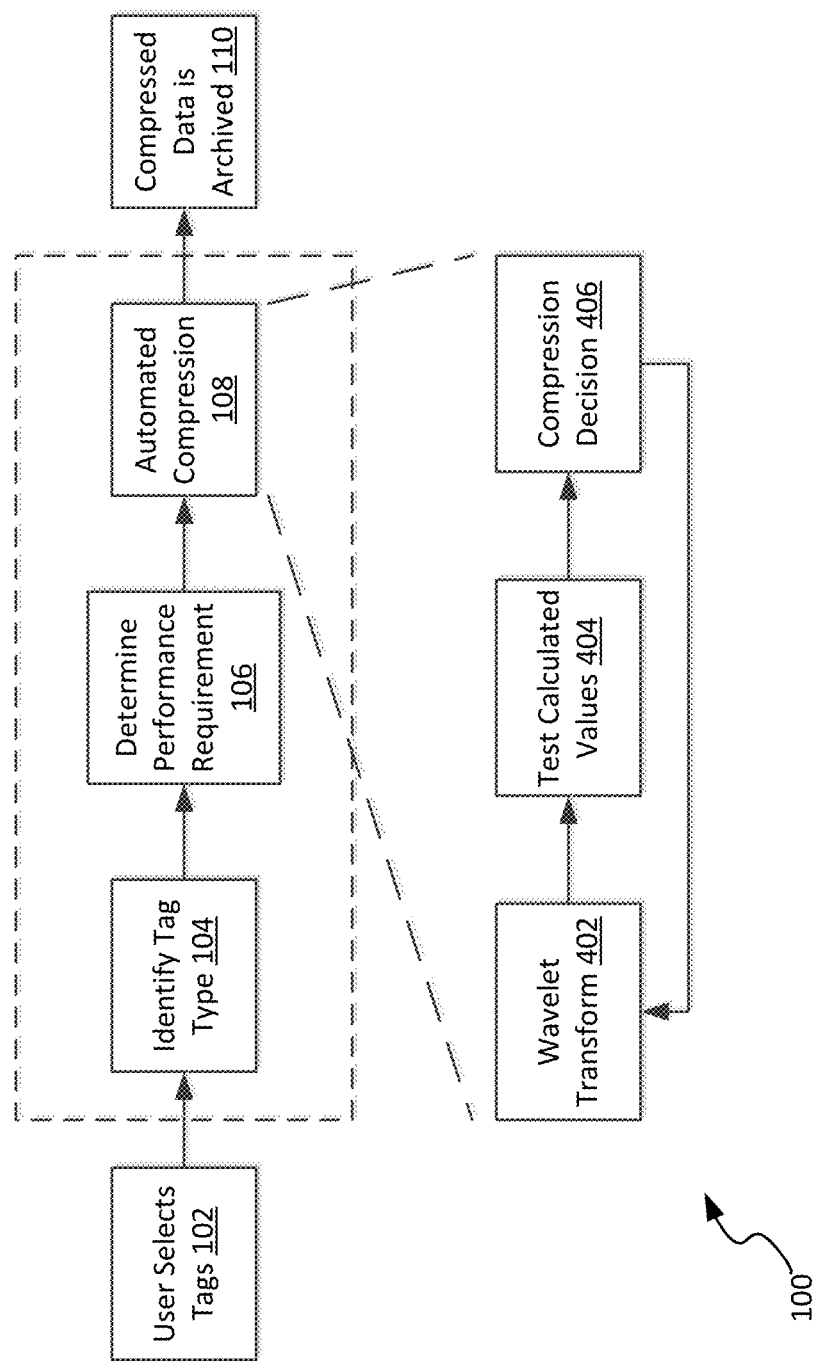
FIG. 4 illustrates an example embodiment of automated data compression in the example system of FIGS. 1A-1B.

The automated compression 108 generally performs a compression operation on the selected tags according to the selected threshold. The automated compression 108 can include, as seen in FIG. 4, iterative performance of a wavelet transform (operation 402), followed by a test of estimated value against received data points (operation 404). The test is comprised of several operations: determination of estimated value, calculation of differences between estimated value and received data points, determination of the maximum difference, and finally comparison of the maximum difference against the threshold. The automated compression 108 can also include a compression decision (operation 406) to retain or discard data based on that test. Such a decision making operation may be performed iteratively upon receipt of new data.

Data compressed by the system is then archived in a compressed data archival 110, which can correspond, for example, to storage of such data in a database or other storage system for further analysis, for example to detect features in such data.

Figure 5:
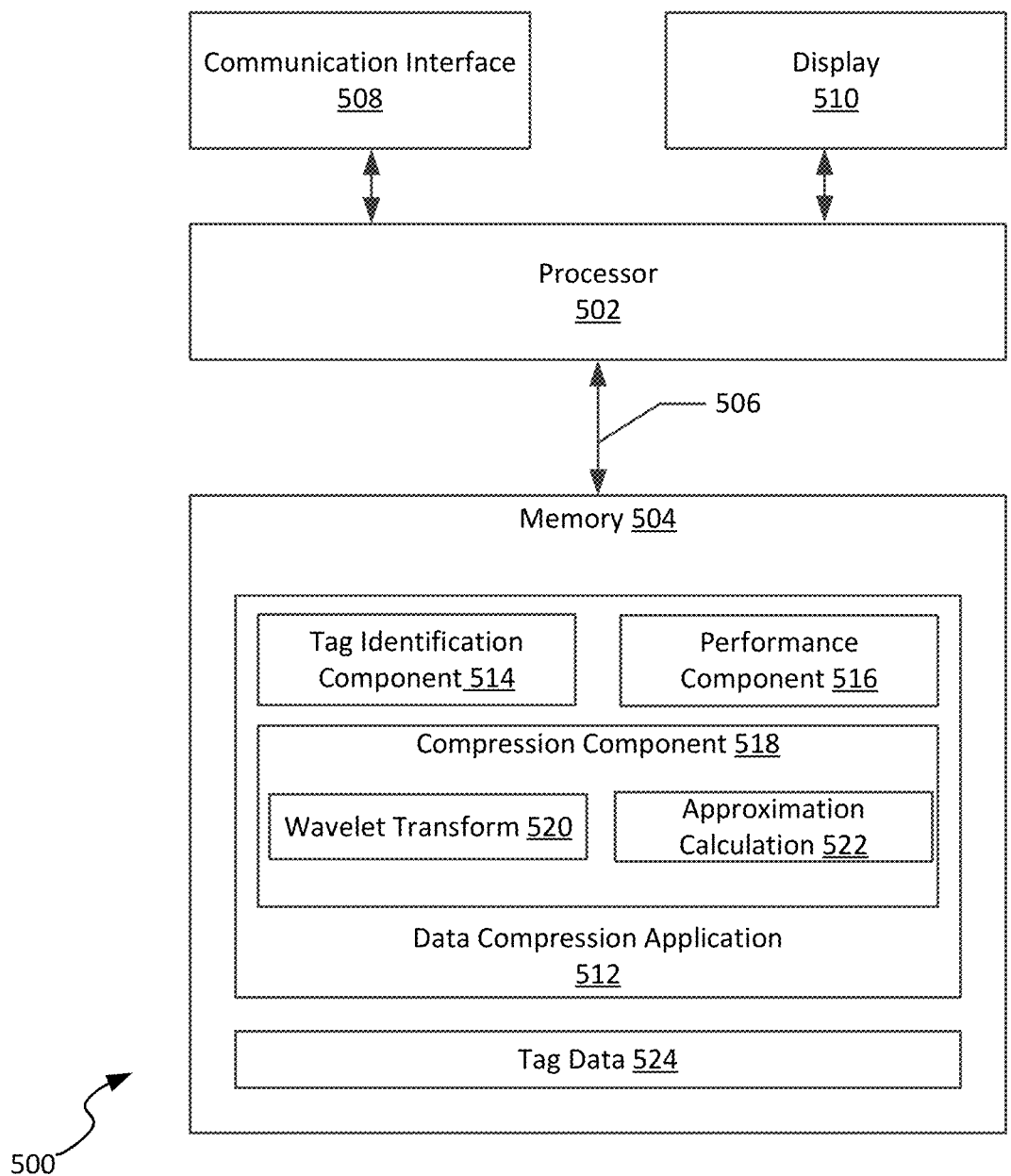
FIG. 5 illustrates a computing system useable to compute permeability of fractures in a hydraulic fracturing operation based on measured electromagnetic signals, according to an example embodiment.

Referring now to FIG. 5, a computing system 500 useable to perform the wavelet-based data compression described herein is disclosed. The computing system 500 can, in example embodiments, be configured to implement the system 100 noted above, for example by receiving a user selection of tags that are intended for compression at the computing system for compression and storage. Accordingly, the computing system 500 can implement the computing system 50 described above in connection with FIG. 1A.

In general, the computing system 500 includes a processor 502 communicatively connected to a memory 504 via a data bus 506. The processor 502 can be any of a variety of types of programmable circuits capable of executing computer-readable instructions to perform various tasks, such as mathematical and communication tasks. The computing system 500 may be a computer.

The memory 504 can include any of a variety of memory devices, such as using various types of computer-readable or computer storage media. For example, the memory 504 may represent or include short term storage (e.g., such as buffer) and long term storage (e.g., such as an archive). Although the terms "short term storage", "long term storage", "buffer", and "archive" are used herein for ease of understanding, those of ordinary skill in the art will appreciate that practically any portion of memory or storage (e.g., such as internal, external, networked, etc.) may be used as "short term storage" and "long term storage". A computer storage medium or computer-readable medium may be any medium that can contain or store the program for use by or in connection with the instruction execution system, apparatus, or device. By way of example, computer storage media may include dynamic random access memory (DRAM) or variants thereof, solid state memory, read-only memory (ROM), electrically-erasable programmable ROM, optical discs (e.g., CD-ROMs, DVDs, etc.), magnetic disks (e.g., hard disks, floppy disks, etc.), magnetic tapes, and other types of devices and/or articles of manufacture that store data. Computer storage media generally includes at least one or more tangible media or devices. Computer storage media can, in some embodiments, include embodiments including entirely non-transitory components. In the embodiment shown, the memory 504 stores a data compression application 512, discussed in further detail below. The computing system 500 can also include a communication interface 508 configured to receive and transmit data, for example data streams representing multiple tags may be received and a user may select one or more tags in operation 102 of FIGS. 1A-4. Additionally, a display 510 can be used for presenting a graphical display of the data compression application 512, viewing and editing of settings associated with various sensor types, including setting thresholds to be used, as well as strings that might be associated with specific sensor types. Other types of viewing and editing operations, such as viewing and editing of archived data, may be possible as well.

In various embodiments, the data compression application 512 includes a tag identification component 514, a threshold component 516, and a compression component 518. The tag identification component 514 presents to a user a selection of one or more tags associated with data streams accessible via the communication interface 508. The tag identification component 514 may, in some embodiments, present to the user a graphical user interface from which tags can be selected. Although in example embodiments tags are selected based on data streams available via the communication interface 508, in alternative embodiments, tags can be selected directly from the memory 504 for this setup item.

The threshold component 516 sets a threshold for compression of data. This can include, for example, setting a desired threshold of compressed data to be within a predetermined amount, or percentage, of sensor range based on an expected accuracy in readings from a particular sensor that are reported in a tag. In example embodiments, a threshold is selected based on a tag type identification, for example during selection of specific tags, and is based on the sensor or other instrument's expected accuracy. As noted above in connection with FIGS. 2-3, a tag type may be determined by searching for a string or engineering units (for example, the string "TI" for temperature tags or the engineering unit "bar" for pressure tags) associated with a particular tag type once this tag type is identified for a tag, a threshold can be set responsive to the tag type. The threshold associated with each instrument type is set by the user. In alternative embodiments, a user may opt to select a single threshold to be applied during compression of each tag, irrespective of tag type by associating the same threshold with all sensor types. A tag is uniquely associated with a particular sensor and data source associated with that sensor. Each sensor pertains to a class of sensors. Sensor classes could be, for example, temperature, pressure, flow, level, etc. (i.e., based upon the sensors' measurand). Tag type and sensor class are two different names for the same thing. Examples—tag type=temperature for a temperature sensor means that the sensor pertains to the temperature class.

One such example, and as noted below, is in the case of a particular tag name, such as "PI100.PV" having units represented in "bar". Accordingly, such a tag may be identified as a time series of pressure readings, with such pressure sensors having a known accuracy of +/−1% of range from the true pressure. Accordingly, the threshold component 516 may, based on the knowledge that this particular tag has an accuracy of +/−1% of range, set a 1% threshold for the compressed tag data as well, or some percentage of the sensor range. In alternative embodiments, absolute values may be used to set a threshold.

The compression component 518 generally performs compression on the selected tags according to the threshold set in the threshold component 516. The compression component 518 can, in various embodiments, embody a wavelet transform 520 and an estimation calculation 522, and subsequent analysis of estimated value as described above in connection with FIG. 4. In specific embodiments, the compression component 518 can employ a wavelet transform methodology analogous to that described below in connection with FIG. 6.

In the embodiment shown, the memory 504 can be configured to also store tag data 524, which can represent either buffered pre-compression data or archived compressed tag data stored after being received and processed by the data compression application. As indicated herein, the memory 504 may represent or include short term storage such as buffer and long term storage such as an archive. Such tag data 524 will have a smaller size than uncompressed data, due to selective archiving of only a portion of the received tag data due to the compression methodology described herein.

Figure 6:
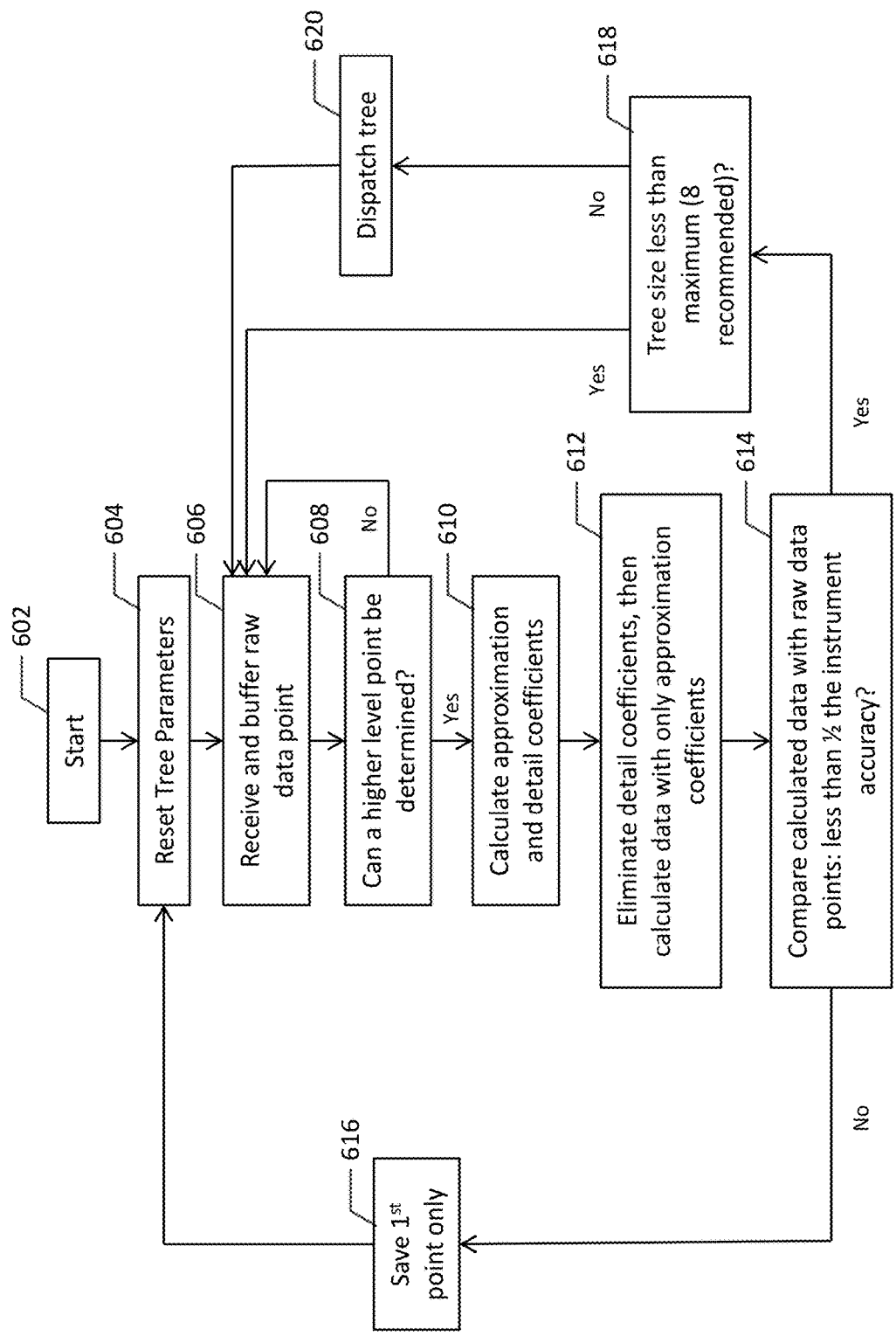
FIG. 6 illustrates a method of performing wavelet-based data compression that can be used in the systems of FIGS. 1A-5, according to an example embodiment of the present disclosure.

FIG. 6 illustrates a method 600 of performing wavelet-based data compression that can be used in the systems of FIGS. 1A-5, according to an example embodiment of the present disclosure. The method 600 can be performed, for example, as part of a larger application, for example within the plant information management system environment, such as the environment provided by OSIsoft of San Leandro, Calif. The method 600 is generally capable of being performed on either static or realtime-dynamic data streams. Generally, the operations of method 600 are described and explained in further detail in connection with an example depicted in FIG. 7, below.

In general, the method 600 describes compression that can be applied to a single data tag, representing a time-series set of data points. It is understood that, in some applications, the method 600 can be individually applied to each of a plurality of data tags, such that the method 600 can be used a number of different times to compress any number of different time-series data sets. For example, the method 600 may be executed three times in parallel for a first data tag, a second data tag, and a third data tag. Alternatively, the method 600 may be executed sequentially three times for the first data tag, the second data tag, and the third data tag.

In the embodiment shown, the method 600 determines whether to store an oldest buffered data point in a compressed data archive, considering all buffered data points in order to make that decision. The buffered data can be, in some embodiments, preserved in a tree structure, with each "leaf" of the tree structure corresponding to a data point in the buffer. In such a logical structure, each of the "branches" will correspond to approximation coefficients that are calculated using a wavelet transform as applied to the leaves from which that approximation coefficient is determined. For example, a tree having two leaves, or data points, will have a single approximation coefficient calculated from those two data points representing a branch. A tree having four leaves, or data points, will have approximation coefficients for the two adjacent data points (e.g., a first approximation coefficient for first and second data points, and a second approximation coefficient for third and fourth data points), as well as a second-level approximation coefficient based on all four data points. Similarly, an eight leaf tree, having eight data points, will have four first level branches, two second level branches, and one third level branch. In example embodiments described below, a tree structure tracking a maximum of eight data points is used; however, such tree structure sizes may be larger or smaller in alternative embodiments. Details regarding such an arrangement are provided in connection with the method 600, described below.

For ease of understanding, in some embodiments: (i) the estimated value may be a single value such as a single data point; (ii) the approximation coefficients may be a single value, 3 values, or 7 values (if the preset maximum tree size is 8); (iii) the differences calculated may range from 1 to 8 values, depending on the number of points in the buffer; (iv) the differences should reflect that the number of data points in the buffer can be either 2, 4, or 8 (if the present maximum tree size is 8); and (v) the maximum difference is a single value, as is the threshold.

In general, the method 600 begins at a start operation (step 602), and initializes a compression process by resetting all tree parameters used in building a tree that determines whether or not to maintain a data point (step 604). The method 600 then includes receiving and storing a next raw data point (step 606). An assessment is performed as to whether a higher level data point within the tree can be determined (step 608). Typically, if the data point is a first data point, no previous data point or higher level data point (in a tree structure) will exist; however, higher level data points will generally correspond to data points that are buffered, previous data points that do not exceed a threshold for a sensor, and therefore represent previous data that has not yet been reflected in storage.

If no higher level data point is determined (in step 608), then the data point is buffered, and a next data point is received (returning to step 606). If a higher level point can be determined, operation proceeds to a wavelet transform operation (step 610), in which a wavelet transform is performed to obtain approximation and detail coefficients. The last approximation coefficient that is calculated, based on the lower level approximation coefficients, is referred to as the highest level approximation coefficient. As an example, when there are two data points in the buffer, there is one approximation coefficient. When there are 4 data points in the buffer, there are 3 approximation coefficients (2 at a first level and 1 at a second level). When there are 8 points in the buffer, there are 7 approximation coefficients (4 at a first level, 2 at a second level, and one at a third level). The single approximation coefficient at the third level may be referred to as the highest level approximation coefficient in this example with up to 8 data points.

The approximation and detail coefficients (A and D, respectively) can be used to obtain insight regarding the data being processed. For example, detail coefficients of a wavelet transform represent noise. Furthermore, first level coefficients using a Haar wavelet requires at the minimum only two data points, which allows for the application of the wavelet transform to real time applications. Therefore, the methods and systems described herein can apply these first level wavelet coefficients to real time decision making for online data compression.

In example embodiments, the wavelet transform performed can be a Haar wavelet transform in which an approximation coefficient (A) can be calculated from $2^n$ pairs of data points, such as in the simplest case, P1, and P2, by way of the following equation: $(P1+P2)/\sqrt{2}$, and a detail coefficient (D) calculated by way of the equation $(P1-P2)/\sqrt{2}$. The discrete Haar wavelet transform can generally be represented by the following equation:

$$\varphi(t) = \begin{cases} 1, & 0 \le t \le 1/2 \\ -1, & 1/2 \le t \le 1 \\ 0, & \text{otherwise} \end{cases}$$

More information regarding the Haar wavelet transform may be found in the following documents, each of which is incorporated herein by reference in its entirety and for all purposes: (i) Mallat, S. A Theory for Multiresolution Signal Decomposition: The Wavelet Representation. IEEE Transactions on Pattern Analysis and Machine Intelligence 11 pp 674-692 (1989); (ii) Misra M, Qin S J, Kumar S, Seeman D. Online data compression and error analysis using wavelet technology. Process Systems Engineering. 46 (1) pp 119-132 (2000); and (iii) Cohen, R. Signal Denoising Using Wavelets. Technicon, Israel Institute of Technology (2011).

Once approximation and detail coefficients are calculated, detail coefficients can be discarded, and data can be estimated using only the highest level approximation coefficient (step 612). This estimated value can be based, for example, on a normal Haar reconstruction, e.g., using $A/\sqrt{2}$, representing a simplification of $(A+D)/\sqrt{2}$ and $(A-D)/\sqrt{2}$ that does not require use of the detail coefficients. The estimated value resulting from $A/\sqrt{2}$ is then compared to raw data points (step 614) to determine if the difference is within (e.g., less than) a predetermined threshold, for example within half of the accuracy associated with a sensor represented by the tag. For example, the predetermined threshold may be based on accuracy of the sensor (e.g., based on the sensor type).

If the maximum difference between this estimated value and the raw data points is not within (e.g., greater than or equal to) the predetermined threshold (typically the case with highly variable data, or data having variability greater than a sensor accuracy), an oldest data point in the time series of data points is archived (step 616), and operation returns to step 604 to reset tree parameters and receive a next data point (at step 606). If the maximum difference between this estimated value and the raw data points is within the predetermined threshold, it is determined whether a tree size is less than a preset maximum tree size (step 618). The maximum tree size can be set, for example, to an 8-data point tree level; however, in alternative implementations, other tree sizes can be set, with an accompanying change in compression level (e.g., higher tree sizes corresponding to greater potential compression). If a tree size that is less than the maximum is reached, a further one or more data points is obtained for consideration alongside the current data points under consideration, returning to step 606. If a tree size that is not less than the maximum is reached, the current data point is archived in long term storage (step 620) and operational flow returns to step 606, in which the tree is reset. By resetting the tree, it is intended that the data points under consideration, other than the data point added to long term storage, are discarded. Following archiving of the current data point, a next data point is retrieved for use/comparison as the next current data point.

Operation within method 600 continues in connection with receipt of data, as subsequent data points are received, transforms performed, and data storage assessed based on the difference between estimated value and raw data points as compared to sensor accuracy.

Now referring to FIGS. 6-7, operation of the method 600 is described in further detail in connection with a particular set of input data points included in association with a single data tag. In this example, the tag reports time-series data points as illustrated below, in Table 1.

TABLE 1

Example Data Points Representing Pressure Over Time

| Data Point ID | Time | Pressure (bar) |
|---|---|---|
| $P_1$ | 1:00 pm | 100.0 |
| $P_2$ | 1:01 pm | 110.0 |
| $P_3$ | 1:02 pm | 120.0 |
| $P_4$ | 1:03 pm | 120.1 |
| $P_5$ | 1:04 pm | 110.0 |
| $P_6$ | 1:05 pm | 110.2 |
| $P_7$ | 1:06 pm | 110.0 |
| $P_8$ | 1:07 pm | 110.3 |
| $P_9$ | 1:08 pm | 110.1 |
| $P_{10}$ | 1:09 pm | 110.1 |
| $P_{11}$ | 1:10 pm | 110.5 |
| $P_{12}$ | 1:11 pm | 110.3 |
| $P_{13}$ | 1:12 pm | 110.0 |
| $P_{14}$ | 1:13 pm | 120.5 |
| $P_{15}$ | 1:14 pm | 115.0 |

In this example, each data point corresponds to a pressure reading/measurement at a particular time. In a real-world implementation, this pressure measurement would likely be one of many diverse measurements and certain set-up steps to determine applicable threshold could be conducted. This setup can include, for example, receipt of a selection of tags and/or performing a text search procedure to identify a tag type and setting a threshold based upon tag type. In this case, the tag name can be set as "PI100.PV" with units in bar. This will indicate that the data corresponds to pressure, which is known to be received from a sensor having an accuracy of +/−0.5%% of the sensor range (200 bar). On the basis of this information about the sensor, the threshold is set at 1 bar. Similar setup steps may be performed for each tag to which wavelet-based data compression is performed.

In processing the above-listed data, the first two data points will be acquired and buffered as P1 and P2, with P1=(1:00 pm, 100.0 bar) and P2=(1:01 pm, 110.0 bar). The wavelet transform is performed, to generate an approximation coefficient and detail coefficient (step 610). The approximation coefficient is calculated as A=(100.0+110.0)/√2=148.49, and the detail coefficient is calculated as D=(100.0−110.0))/√2=−7.071. The generated approximation coefficient is used to calculate a single estimated value (referred to as an estimated point, or "EP") that represents both values, at step 612, i.e., $EP_{12}$=148.49/√2=105.0 bar.

At step 614, a difference is calculated between the estimate and the data points:

$$Diff_{12} = \max(|EP_{12} - (P1, P2)|)$$
$$= \max(|105(100, 110)|)$$
$$= 5$$

Accordingly, this difference is calculated by comparing the estimated value and the existing data points in the buffer with the difference being compared to the threshold (in this case, 1 bar) in a tree including those data points (e.g., a 2-point tree). Because, in this case, the difference is above the threshold for the tag type, a first data point is stored in the archive. (via step 616).

After the first data point is archived, the tree parameters are reset (at step 604). This corresponds to removing from the buffer the oldest half of the point(s) in the tree (P1 in this case) and maintaining only the most recently received data point(s) in the tree (P2 in this case). Once tree parameters are reset, a third data point is received, in this case P3 (1:02 pm, 120.0 bar) (at step 606). As above, now that two points are in the tree, approximation and detail coefficients are calculated; however, in this case, these steps are performed using P2 and P3. Additionally, a difference between these two points is calculated:

$$A_{23} = 162.63$$

$$D_{23} = -7.07$$

$$EP_{23} = 115$$

$$Diff_{23} = 5$$

Again, in this case, because the difference is above the threshold, data point P2 is stored in the archive. It is noted that a difference will be consistently above a threshold when data is highly variable.

P3 is retained as the tree is reset in step 604, the method 600 then includes obtaining data point P4 (1:03 pm, 120.1 bar), and a wavelet transform is performed, with estimated point and difference calculations further performed as well:

$A_{34}=169.78$ $D_{34}=-0.071$ $EP_{34}=120.05$ $\text{Diff}_{34}=0.05$

In this event, difference $\text{Diff}_{34}$ is below the threshold so these two data points (P3 and P4) are buffered (i.e. they remain in the tree), but not included in the archive. Rather, two more data points are obtained, e.g., P5 (1:04 pm, 110.0 bar) and P6 (1:05 pm, 110.2 bar) because the Haar wavelet requires $2^n$ data points for analysis to be performed. In this case, the Haar wavelet decomposition is performed as to all four data points to generate a single approximation coefficient, using separate approximation coefficients $A_{34}$ and $A_{56}$:

$A_{34}=(P3+P4)/\sqrt{2}$ $A_{56}=(P5+P6)/\sqrt{2}$ $A_{3\text{-}6}=(A_{34}+A_{56})/\sqrt{2}$ In this case, approximation and detail coefficients are calculated accordingly:
Approximation Coefficients:

$A_{34}=169.78$ $A_{56}=155.70$ $A_{3\text{-}6}=(169.78+155.70)/\sqrt{2}$ $A_{3\text{-}6}=230.15$ Detail Coefficients:

$D_{34}=-0.071$ $D_{56}=-0.141$

A single estimated data point is then calculated to represent all four values, i.e. $EP_{3\text{-}6}=(A_{3\text{-}6}/\sqrt{2})\sqrt{2}=(232.65/\sqrt{2})/\sqrt{2}=115.075$. It is noted that although detail coefficients are illustrated above, they are ultimately not used; accordingly, it may be that in some embodiments, detail coefficients are not calculated at all.

Following calculation of the estimated data point, a difference is calculated between the estimated data point and the four data points in the buffer: $\text{Max}(\text{Err}_{3\text{-}6})=5.075$ Because this difference is above a threshold associated with the tag type (as determined at step 614), the method 600 results in archiving of only the first data point (P3) (at step 616) and resetting of tree parameters (at step 604) (i.e., removing from the buffer the older half of the data points in the tree). Specifically, a first data point in the group is maintained in the archive (P3) (at step 616) and the second data point (P4) is removed from the buffer (e.g., due to the previous determination of $\text{Err}_{34}$ below the threshold)). In this case, unlike during consideration of P2 and P3, P4 is removed from the buffer because it had previously passed the determination in step 614. Therefore, analysis continues from P5 which represents the next data point after the tree section (including P3, P4) that was reset.

In the above case, a first tree (P3 and P4) contains two data points which are close to each other so that the difference is less than the threshold. In this case, the tree grows to 4 points (P3-P6). With 4 points, because the difference is greater than or equal to the threshold, then the smaller tree (containing the first two data points) 'passes the test' that the difference is less than the threshold. Therefore the method 600 results in a determination that only a first of those two data points is required to be archived, but the remaining two data points in that tree must be further considered for archiving (P5 & P6). However, if at the 4-point tree, the difference remains below the threshold, then the tree could grow to 8 points (e.g., by branching "yes" at step 614) (with the Haar wavelet requiring $2^n$ data points for analysis to be performed). Now with 8 points, if the difference is greater than or equal to the threshold, the smaller tree (of 4 data points) 'passed the test'. The smaller tree of 4 points would be compressed to 1 (meaning only a first data point would be archived), and testing would resume from P7.

Conversely if the 8-point tree resulted in a difference less than the threshold, then the tree could hypothetically grow infinitely (and more than eight data points could be compressed into a single data point). However, every time the tree grows, more values have to be buffered, which will quickly cause too much load on the computer. Therefore, a maximum tree size is set. Based on experimentation, a maximum tree of 8 points has been seen to provide sufficiently superior results to conventional methods in terms of compression, while controlling the amount of buffered data. However, in alternative embodiments, to maintain improved compression, such a maximum tree size can be changed. So, using a maximum of 8, then the tree would be dispatched. Dispatch refers to storage in the archive of the oldest data point in the buffer and then removal of all data points from the tree (i.e., all data points in the buffer). In some embodiments, removal of all data points from the tree includes removal of all of the data points from the buffer or short term storage, and only the oldest point is stored in one location, which is the archive or long term storage.

Continuing the above example with data from Table 1 and starting at P5, if the difference is again below the threshold with four points (P5-P8), four additional points are received, for buffering a total of eight data points (P5-P12), and approximation and detail coefficients are calculated as follows (shown in tree structure) where $A_{5\text{-}12}$ is the highest level approximation coefficient:
Approximation Coefficients:

$A_{56}=155.079 \ A_{5\text{-}8}=220.25$ $A_{78}=155.78 \ A_{5\text{-}12}=311.59$ $A_{910}=155.70 \ A_{9\text{-}12}=220.40$ $A_{1112}=155.99$ Detail Coefficients:

$D_{56}=-0.141$ $D_{78}=-0.212$ $D_{910}=0$ $D_{1112}=0$

In addition, a difference is calculated, $\text{Max}(\text{Diff}_{5\text{-}12})=0.16$ Because the difference, in this case, is below the threshold, the first point P5 is archived, and the remaining data points are not archived, but are removed from buffered memory. The same operations are then performed on data points P13-P14, with results being that each of those P13 and P14 are archived and P15 is retained in the buffer going forward.

Figure 7:
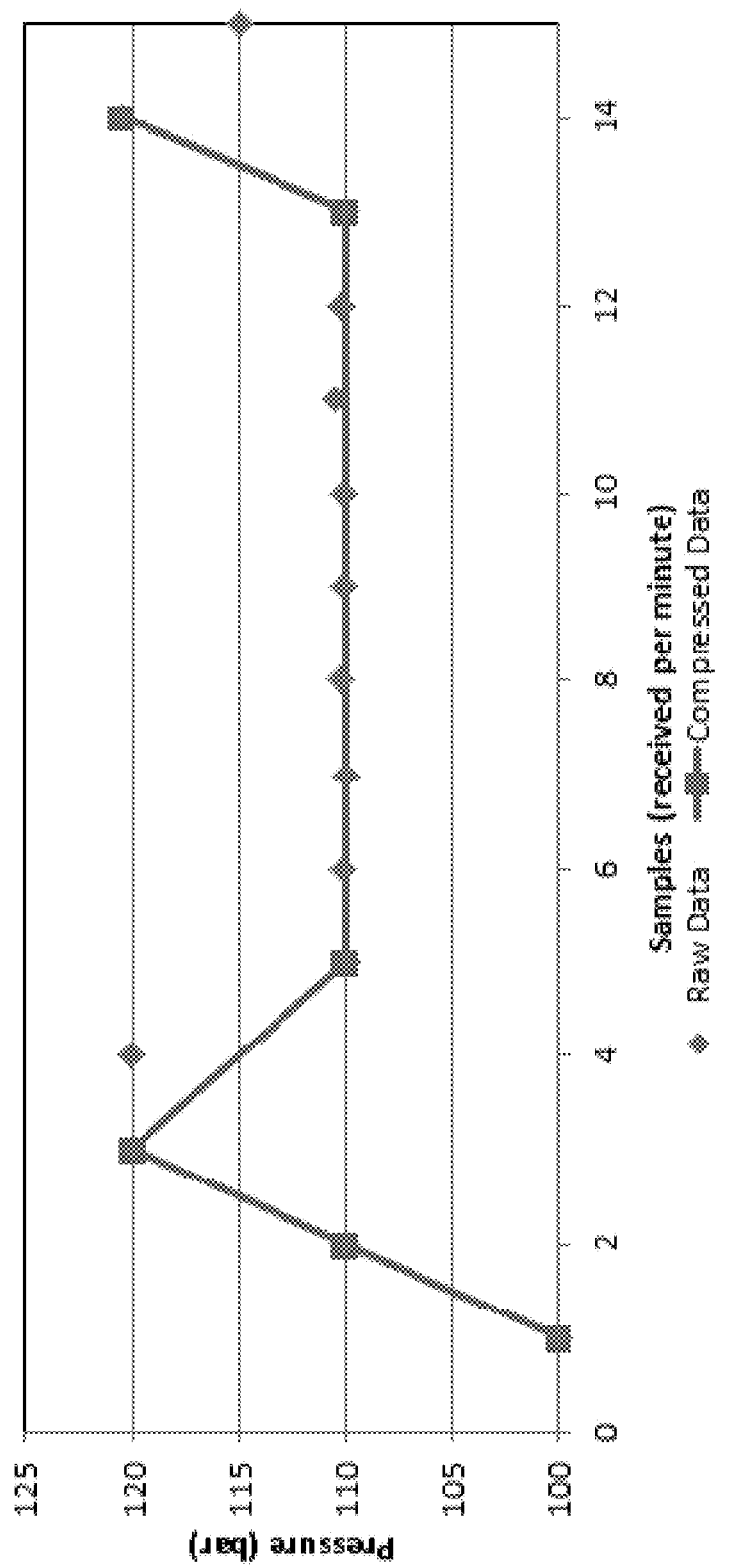
FIG. 7 illustrates a chart including a set of example data points with which operation of the method of FIG. 6 can be illustrated.

The chart 700 of FIG. 7 illustrates compression of the sample data points of Table 1, above. Such compressed data is also seen in Table 2, below:

TABLE 2

Compressed Data from Table 1

| Data Point ID | Time | Pressure (bar) |
|---|---|---|
| $P_1$ | 1:00 pm | 100.0 |
| $P_2$ | 1:01 pm | 110.0 |
| $P_3$ | 1:02 pm | 120.0 |
| $P_5$ | 1:04 pm | 110.0 |
| $P_{13}$ | 1:12 pm | 110.0 |
| $P_{14}$ | 1:13 pm | 120.5 |

As seen in Table 2 and depicted in FIG. 7, where data stabilizes at a particular value or varies only within a small range (or gradually), such changes in data can be compressed such that relatively few data points are preserved. In this example, seven of fifteen data points are preserved, resulting in a greater than 50% compression rate. Of course, such compression rates are based at least in part on the tree size used, as well as the constancy of the data to be compressed.

It is noted that, in some embodiments, the compression algorithm described herein will be used within the context of a tool (e.g., the plant information management system environment, such as the environment provided by OSIsoft of San Leandro, Calif.) that will automatically carry out linear interpolation between the data points preserved after compression. Overall results are shown, with original data shown as data points, and compressed data illustrated in the line graph, of FIG. 7.

As compared to an existing swinging door methodology, the present wavelet-based methodology has several advantages over that traditional method, which is used in typical plant information management software. For example, the wavelet-based compression method described herein can be automated, and requires limited or no input or decision making from the user during setup. In other words, the setup itself may be completely or almost automated. In addition, compression errors in this method are very low compared to a swinging-door method, while the compression ratios are also improved. Furthermore, the methods and systems described herein compress each unique tag without significant effort on the part of a user to set multiple parameters per tag, eliminating the tedious step of inputting compression parameters for each tag. The methods and systems described herein are also particularly designed to work in a plant information management system, because the methods and systems are particularly applicable to time-series data. Furthermore, the present methodology is useable in systems that receive data at varying times (e.g., not at regular intervals). Finally, although other compression methodologies may change the form of the data and require a reconstruction step, the present methodology only uses the wavelet transform in decision-making but retains the data in its original form.

Referring now to FIGS. 8-13, additional example data sets are shown on which wavelet-based compression is performed, according to an example embodiment of the present disclosure. The data sets of FIGS. 8-13 generally illustrate close correlation between raw and compressed data, and preservation of features and other non-constant data within a data set.

Figure 8:
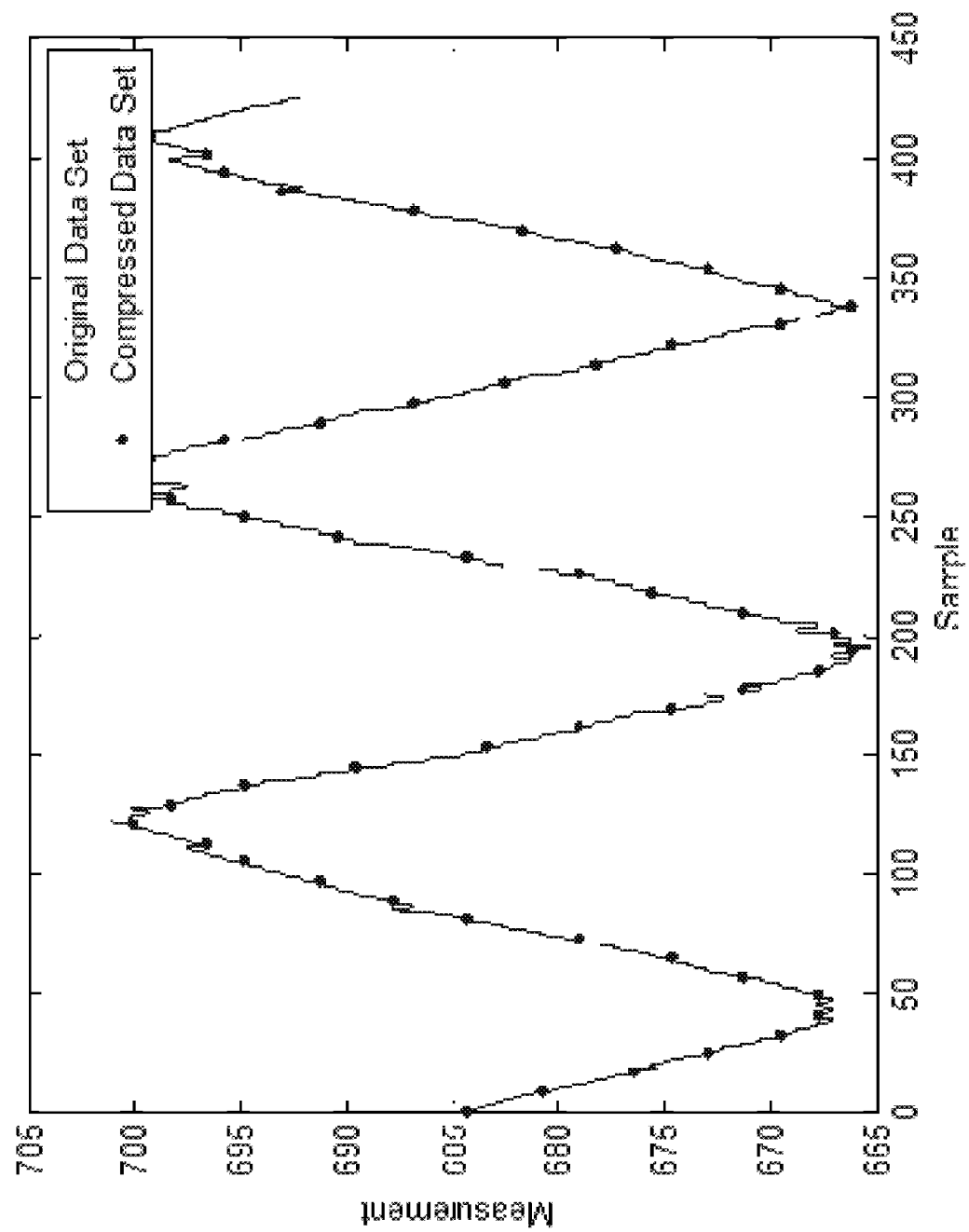
FIG. 8 illustrates a first example chart comparing raw and compressed data according to the methods and systems described herein, using wavelet-based data compression.

Referring to FIG. 8, a first example chart 800 is shown comparing raw and compressed data according to the methods and systems described herein, using wavelet-based data compression. In this example, the raw data represents a generally sinusoidal curve of data points having a predetermined frequency. In this example, 425 data points were captured. An accuracy threshold is set to 0.25%. The wavelet-based compression results in preservation of 77 data points out of the 425 original data points, or a compression ratio of 18.11%, with a maximum absolute compression error of 1.028. Accordingly, it is illustrated that, for this data set, compression is highly effective, because the compression ratio (which is a percent value that compares compressed size to uncompressed size) is low, while the compression error (which determines a resulting error between original and compressed data if reconstructed) is near 1, despite a wide range of data values.

Figure 9:
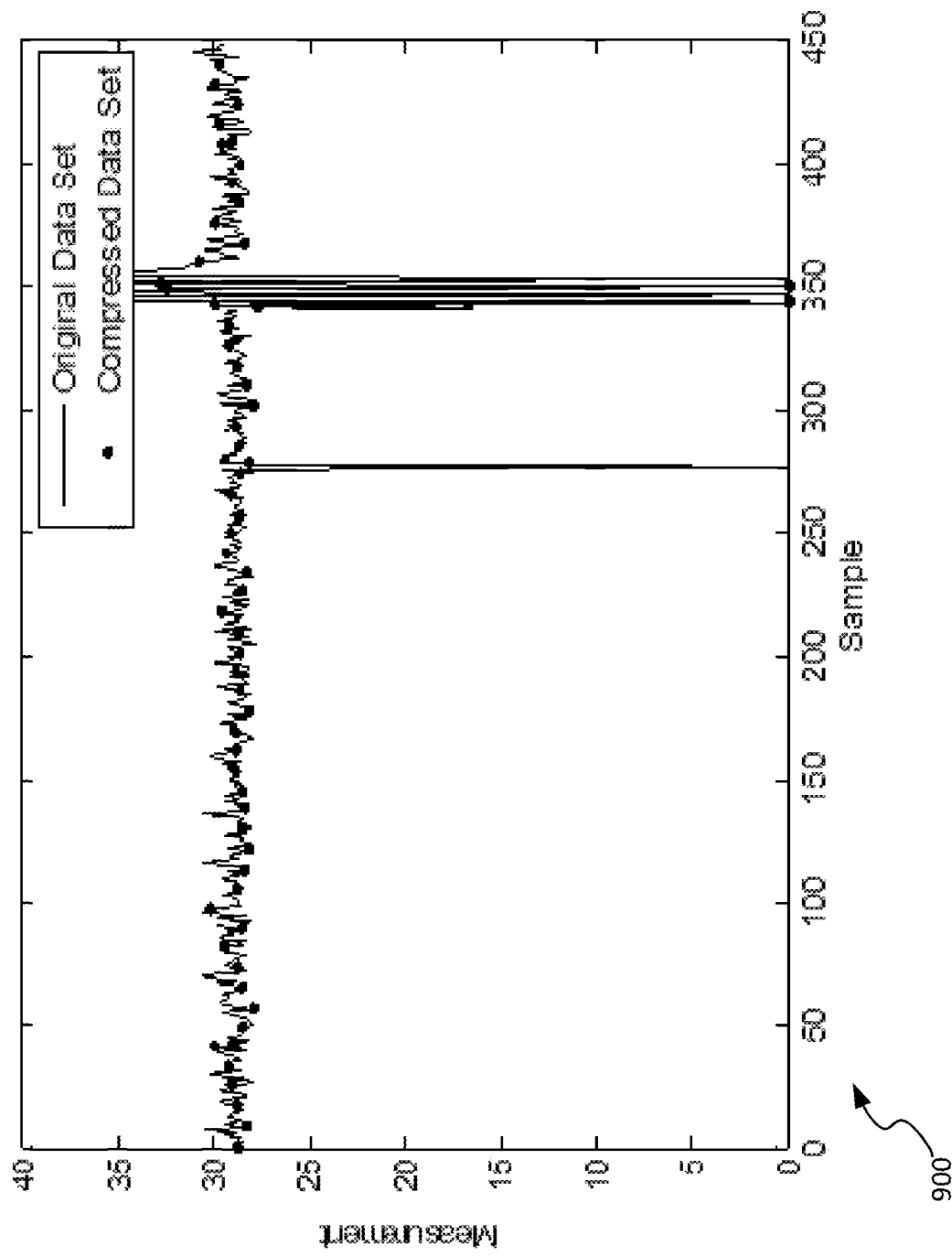
FIG. 9 illustrates a second example chart comparing raw and compressed data according to the methods and systems described herein, using wavelet-based data compression.

FIG. 9 illustrates a second example chart 900 comparing raw and compressed data according to the methods and systems described herein, using wavelet-based data compression. In this example, an instrument range of 1500 is used, with an accuracy of +/−0.25%. As seen in the raw and compressed data comparison, features in the time window between 250 and 400 seconds illustrate that, in both cases, the features are preserved. Outside that time window, the compressed data generally tracks the raw data, within a predetermined threshold performance level as explained above.

Figure 10:
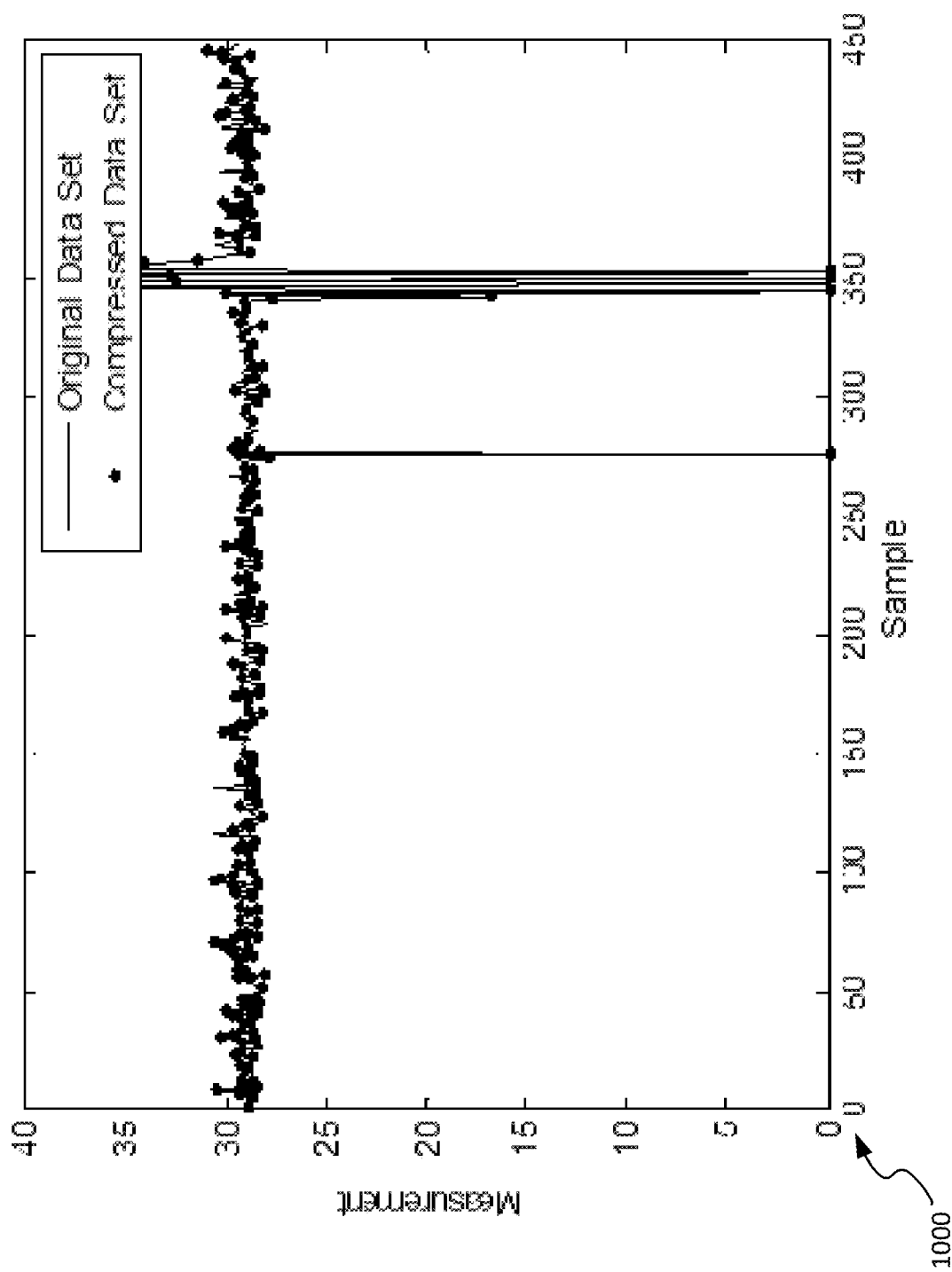
FIG. 10 illustrates a third example chart comparing raw and compressed data according to the methods and systems described herein, using wavelet-based data compression.

Similar behavior is illustrated in FIG. 10, which shows a third example chart 1000, comparing raw and compressed data according to the methods and systems described herein, using wavelet-based data compression. In this example, relatively constant data is closely tracked, while in windows in which features are detected (e.g., the window from 250-300 sec., and from 325-375 sec) features experienced in the raw data are preserved and archived in the compressed data.

By way of comparison between FIGS. 9 and 10, the example of FIG. 9 used an instrument range of 1500 and the example of FIG. 10 used an instrument range of 150, with the same precision setting. In these cases, the example of FIG. 9 had a 14.06% compression ratio, while the example of FIG. 10 had a 53.35% compression ratio. In other words, a greater number of data points were stored when the instrument range was lower. As can be seen, the smaller instrument range resulted in smaller changes being considered more important. Furthermore, as compared to a swinging door method when using the same +/−1% accuracy setting, that swinging door method results in a 79.8% compression ratio as compared to a 22.5% compression ratio for the same data set using wavelet-based compression. Furthermore, as seen in both cases in FIGS. 9-10, unusual or faulty system behavior is preserved due to the outliers being outside the set threshold. Accordingly, a separate data analysis or cleansing process can be performed, such as the one described in DESHPANDE, Alisha, et al.; "Automated Real-time Process Data Analysis Using Online Wavelet Transforms: Fault Detection, Data Cleansing and Compression"; 2016 (SPE-181089-MS), all pages, which is incorporated herein by reference in its entirety and for all purposes.

Figure 11:
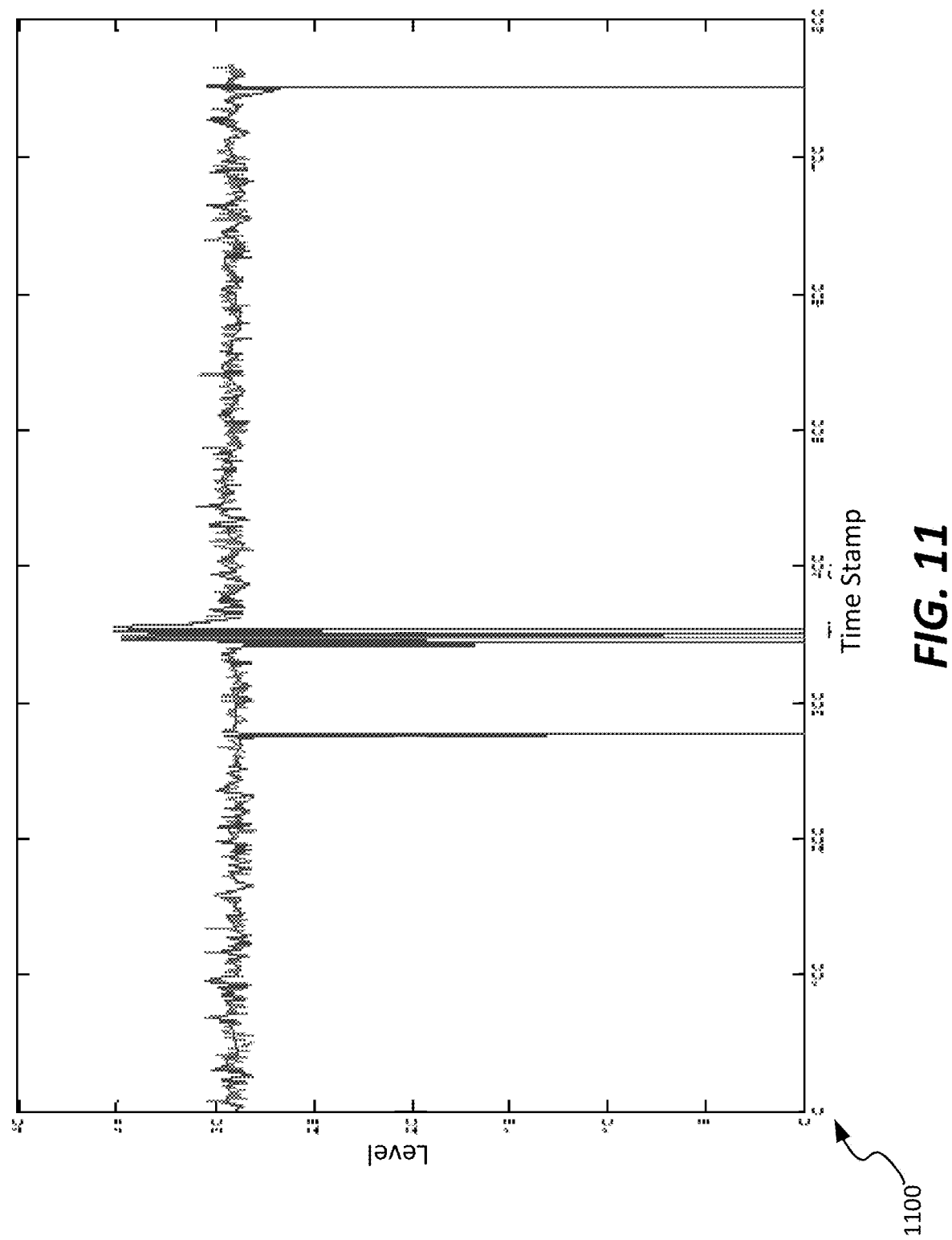
FIG. 11 illustrates a fourth example chart comparing raw and compressed data according to the methods and systems described herein, using wavelet-based data compression.
Figure 12:
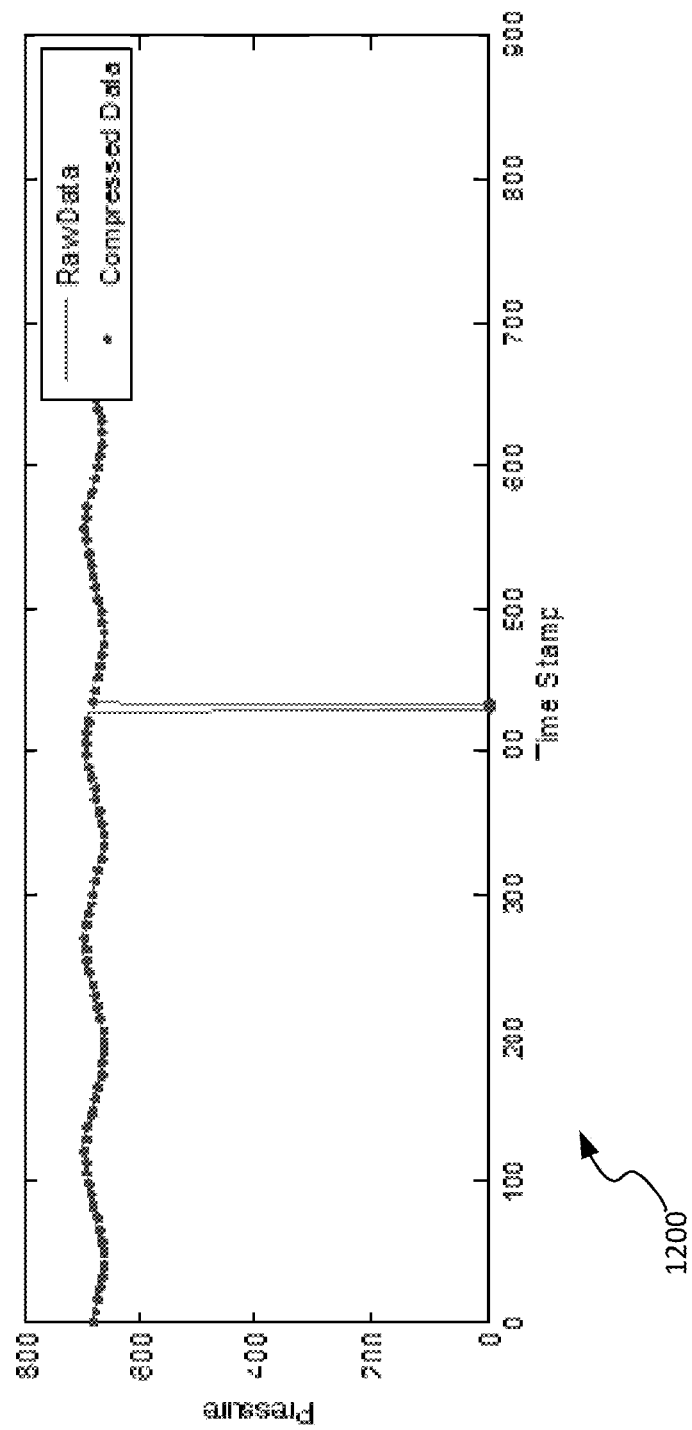
FIG. 12 illustrates a fifth example chart comparing raw and compressed data according to the methods and systems described herein, using wavelet-based data compression.
Figure 13:
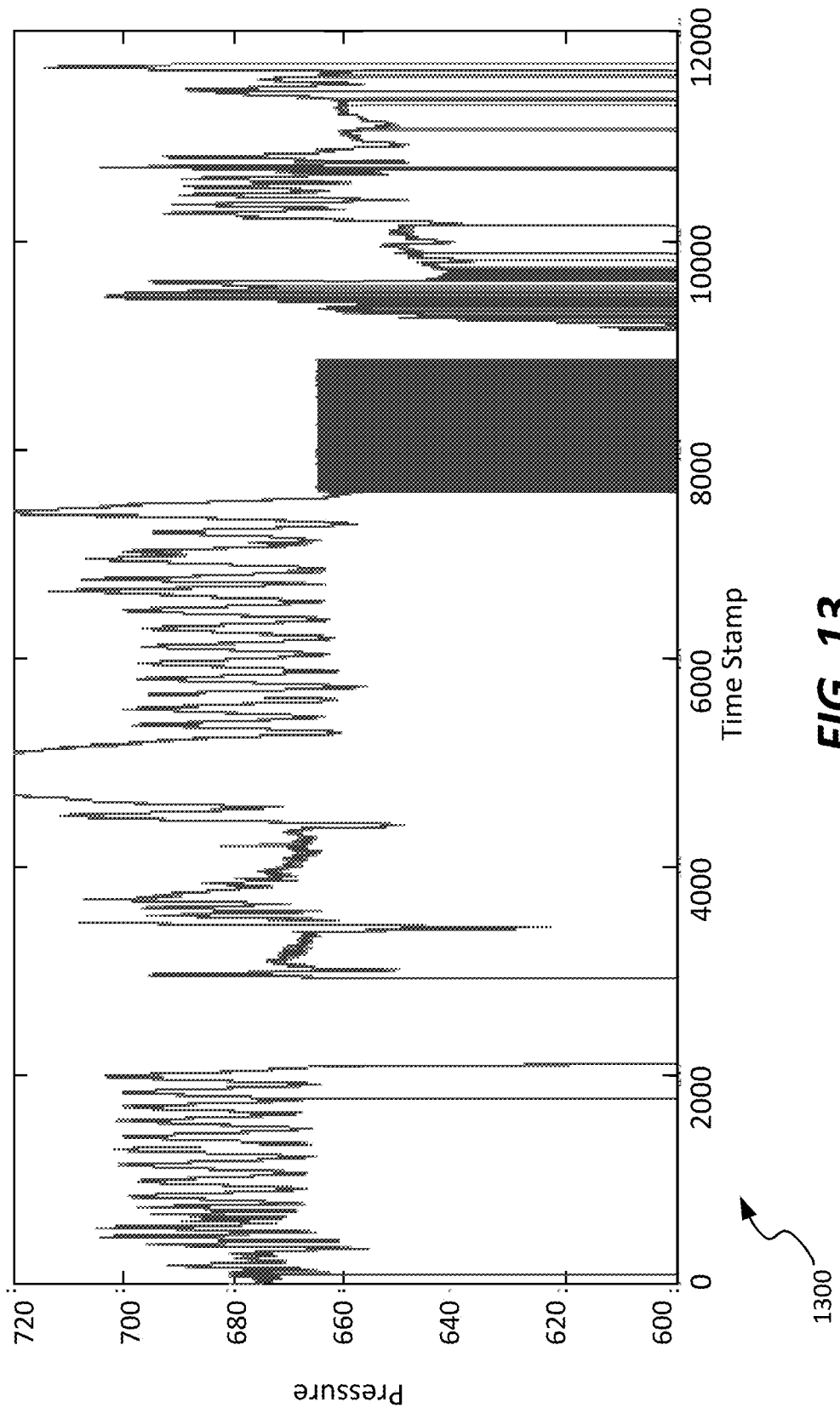
FIG. 13 illustrates a sixth example chart comparing raw and compressed data according to the methods and systems described herein, using wavelet-based data compression.

Still further examples are shown in FIGS. 11-13, in which both smooth (e.g., relatively constant or predictable) and non-smooth (e.g., having a great deal of noise) data sets are tested relative to the wavelet-based compression methodologies described herein. FIG. 11 illustrates a chart 1100 including generally constant, noisy data having isolated, larger features. As seen in that chart 1100, smaller noises within the range of the predetermined performance threshold are generally smoothed, while larger features are preserved. Such noise may be, for example, based on variability in sensor readings, which, although it would produce variable data points, those data points do not vary in a way that would indicate a feature in the underlying system, and therefore can be discarded and should not generally be used for analysis. In FIG. 12, chart 1200 shows a sinusoidal wave having a feature shortly after 400 seconds; in that example, the wave is generally followed closely, while the brief feature is also preserved.

FIG. 13 shows a chart 1300 including highly variable data in which most changes in the raw data are preserved in the compressed data. In this example, because changes among data points are much greater than the performance threshold, the compressed data closely tracks the raw data, although in this example compression rates (e.g., a rate or extent to which data can be compressed from original data) will generally be lower than in the case of constant data.

Referring generally to the systems and methods of FIGS. 1-13, and referring to in particular computing systems embodying the methods and systems of the present disclosure, it is noted that various computing systems can be used to perform the processes disclosed herein. For example, embodiments of the disclosure may be practiced in various types of electrical circuits comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to mechanical, optical, fluidic, and quantum technologies. In addition, aspects of the methods described herein can be practiced within a general purpose computer or in any other circuits or systems.

Embodiments of the present disclosure can be implemented as a computer process (method), a computing system, or as an article of manufacture, such as a computer program product or computer readable media. The term computer readable media as used herein may include computer storage media. Computer storage media may include volatile and nonvolatile, removable and non-removable media implemented in any method or technology for storage of information, such as computer readable instructions, data structures, or program modules. Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the computing system 500, above. Computer storage media does not include a carrier wave or other propagated or modulated data signal. In some embodiments, the computer storage media includes at least some tangible features; in many embodiments, the computer storage media includes entirely non-transitory components.

Furthermore, although generally discussed in the context of industrial processes, such as in the case of hydrocarbon production facilities, other applications for such data compression techniques exist as well. For example any instance in which sensor data is received could potentially benefit from such data compression techniques. One example may be for compression of data from advanced sensors with high data rates, such that existing communication systems cannot transmit data at the rate collected (e.g., due to bandwidth limitations). In such an instance, such sensor data could be compressed prior to transmission, while preserving the information content.

In a particular example, seismic data could be compressed as well, with the advantage that such compression could be performed in realtime, while removing any potential bandwidth constraint even in cases where seismic data is captured at locations from which high datarate transmission is difficult, inconvenient, or expensive. The seismic data may include at least one 2D digital image of the subsurface of interest, and/or at least one 3D digital image of the subsurface of interest. A user may provide the coordinates in latitude and longitude or otherwise select the subsurface of interest, for example, using I/O devices, and a computing system may receive the seismic data corresponding to that subsurface of interest. For example, the seismic data may be received from an external source, such as a database or storage medium, a networked computing system, one or more vendors specializing in generating seismic data, etc. Accordingly, compression of seismic data can be performed within the context of, e.g., data storage and transmission in the context of remote monitoring of drilling operations (e.g., for hydrocarbon exploration/harvesting) and for reservoir management, where data may need to be compressed.

Furthermore, and more fundamentally, any application in which reduced storage of streaming data, or reduced bandwidth for such streaming, may benefit from the data compression techniques described herein, with appropriate thresholds developed for use in compression.

Accordingly, in aspects of the present disclosure, systems and methods for processing time series data are disclosed. Some such systems compress such time series data, and can be implemented as directed to sensor data, such as from seismic sensors, or sensors associated with an industrial process. A system can include a processor and a memory communicatively connected to the processor, wherein the memory includes a short term storage and a long term storage, and wherein the memory storing computer-executable instructions. The instructions, when executed, cause the processor to receive a plurality of data points in a time-series at the short term storage; calculate at least one approximation coefficient based on the plurality of data points using a wavelet transform, including calculating a highest level approximation coefficient; calculate an estimated value based on the highest level approximation coefficient; calculate differences between the estimated value and the plurality of data points of the short term storage; determine whether a maximum difference among the calculated differences is less than a predetermined threshold; and based on the maximum difference being greater than or equal to the predetermined threshold, store the oldest data point of the short term storage in the long term storage. In example aspects, the instructions can further cause the system to remove the oldest data point from a tree in the short term storage. The wavelet transform can be, for example, a Haar wavelet transform.

In some further example aspects, the plurality of data points are received as a selected data tag associated with a data stream including the data points in the time series, and the predetermined threshold is based on an accuracy of the source of the data points. For example, the data points can represent an output of a sensor associated with an industrial process. The industrial process can be a hydrocarbon production process in operation at a hydrocarbon production facility. The accuracy can be based on the sensor accuracy.

In further example aspects, calculating the at least one approximation coefficient is based on a first data point and a second data point, and storing the oldest data point in the long term storage includes storing the first data point and the second data point remains in the short term storage. Furthermore, based on the maximum difference being less than the predetermined threshold, the system can determine whether a current tree size of a tree in the short term storage that includes the data points is less than a preset maximum tree size. Based on the current tree size being less than the preset maximum tree size, the system can use at least one remaining data point in the short term storage to start a new tree in the short term storage, wherein the at least one remaining data point in the short term storage includes a second data point. The system can also subsequently receive at least one new data point in a time-series at the short term storage and add the at least one new data point to the new tree, wherein the at least one new data point in the new tree includes a third data point. In some examples, the preset maximum tree size is eight data points.

In some examples, the instructions included in such a system can cause the system to calculate at least one approximation coefficient based on a second plurality of data points in time series using the wavelet transform, including calculating a second highest level approximation coefficient; and wherein the second plurality of data points are located in the new tree in short term storage; calculate a second estimated value based on the second highest level approximation coefficient; calculate differences between the second estimated value and the second plurality of data points determine whether a second maximum difference among the calculated second differences is less than the predetermined threshold; based on the second maximum difference being less than the predetermined threshold, determine whether a tree size of the new tree is less than the preset maximum tree size; and based on the tree size of the new tree being less than the preset maximum tree size, receive at least two new data points in a time-series for consideration with the second and third data points, including receiving at least a fourth data point and a fifth data point. In such example aspects, the first and second plurality of data points can correspond to the same tag. Furthermore, based on the tree size of the new tree being equal to the preset maximum tree size, the system can dispatch the new tree.

The description and illustration of one or more embodiments provided in this application are not intended to limit or restrict the scope of the invention as claimed in any way. For example, in some embodiments, those of ordinary skill in the art will appreciate that the inventive concepts can be performed without the use of any trees. Alternatively, for example, the portions herein that reference a tree can be replaced with an array of data points. In short, the inventive concepts may be applied to practically any data points that are in time-series (or timestamped), and for example, the quantity of data points can be compared to a preset maximum quantity (similar to the preset maximum tree size described herein), approximation coefficients may still be calculated as described herein, estimated value may still be calculated as described herein, a difference and a maximum difference may still be calculated as described herein, etc. More information may also be found in DESHPANDE, Alisha, et al.; "Automated Real-time Process Data Analysis Using Online Wavelet Transforms: Fault Detection, Data Cleansing and Compression"; 2016 (SPE-181089-MS), all pages, which was above incorporated herein by reference in its entirety and for all purposes.

The embodiments, examples, and details provided in this application are considered sufficient to convey possession and enable others to make and use the best mode of claimed invention. The claimed invention should not be construed as being limited to any embodiment, example, or detail provided in this application. Regardless whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate embodiments falling within the spirit of the broader aspects of the claimed invention and the general inventive concept embodied in this application that do not depart from the broader scope.

The invention claimed is:

1. A system for compressing time-series data, the system comprising: a processor; a memory communicatively connected to the processor, wherein the memory includes a short term storage and a long term storage, and wherein the memory storing computer-executable instructions which, when executed, cause the processor to perform: (a) receiving a plurality of data points in a time-series at a current tree in the short term storage; (b) calculating at least one approximation coefficient based on the plurality of data points using a wavelet transform, including calculating a highest level approximation coefficient; (c) calculating an estimated value based on the highest level approximation coefficient; (d) calculating differences between the estimated value and the plurality of data points of the short term storage; (e) comparing whether a maximum difference among the calculated differences is less than a predetermined threshold; and (f) based on the maximum difference being greater than or equal to the predetermined threshold, preparing a compressed data set by storing the oldest data point in the time-series of the short term storage in the long term storage, discarding the oldest half of the data points in the time-series and coefficients from the short term storage, and retaining the newest half of the data points in the short term storage; and receiving one or more new data points into a new tree and repeating steps (b)-(e); (g) based on the maximum difference being less than the predetermined threshold, determining whether a tree size of the current tree is less than a preset maximum tree size; (g)(1) if the tree size of the current tree is less than the preset maximum tree size, receiving one or more new data points into a new tree and repeating steps (b)-(e), and (g)(2) if the tree size of the current tree is equal to the preset maximum tree size, preparing the compressed data set by storing the oldest data point in the time-series of the short term storage in the long terra storage and discarding all coefficients and all data points in the current tree in the short term storage; and receiving one or more new data points into a new tree and repeating steps (b)-(e).

2. The system of claim 1, wherein receiving the plurality of data points in the time-series includes receiving a selection of a data tag associated with a data stream including the plurality of data points in the time-series.

3. The system of claim 1, wherein the predetermined threshold is based on accuracy of a source of the plurality of data points.

4. The system of claim 1, wherein the plurality of data points represents output of a sensor associated with an industrial process.

5. The system of claim 4, wherein the industrial process comprises a hydrocarbon production process in operation at a hydrocarbon production facility.

6. The system of claim 1, wherein the preset maximum tree size is eight data points.

7. The system of claim 1, wherein the plurality of data points and the one or more new data points correspond to a same tag.

8. The system of claim 1, wherein the wavelet transform comprises a Haar wavelet transform.

9. A computer-implemented method of compressing time-series data, the method comprising: (a) receiving a plurality of data points in a time-series at a current tree in a short term storage; (b) calculating at least one approximation coefficient based on the plurality of data points using a wavelet transform, including calculating a highest level approximation coefficient; (c) calculating an estimated value based on the highest level approximation coefficient; (d) calculating differences between the estimated value and the plurality of data points of the short term storage; (e) comparing whether a maximum difference among the calculated differences is less than a predetermined threshold; and (f) based on the maximum difference being greater than or equal to the predetermined threshold, preparing a compressed data set by storing the oldest data point in the time-series of the short term storage in a long term storage, discarding the oldest half of the data points in the time-series and coefficients from the short term storage, and retaining the newest half of the data points in the short term storage; and receiving one or more new data points into a new tree and repeating steps (b)-(e); (g) based on the maximum difference being less than the predetermined threshold, determining whether a tree size of the current tree is less than a preset maximum tree size; (g)(1) if the tree size of the current tree is less than the preset maximum tree size, receiving one or more new data points into a new tree and repeating steps (b)-(e), and (g)(2) if the tree size of the current tree is equal to the preset maximum tree size, preparing the compressed data set by storing the oldest data point in the time-series of the short term storage in the long term storage and discarding all coefficients and all data points in the current tree in the short term storage; and receiving one or more new data points into a new tree and repeating steps (b)-(e).

10. The method of claim 9, wherein the predetermined threshold is based on accuracy of a source of the plurality of data points.

11. A system for compressing time-series data generated by a hydrocarbon production facility, the system comprising: a processor; a memory communicatively connected to the processor, wherein the memory includes a short term storage and a long term storage, and wherein the memory storing computer-executable instructions which, when executed, cause the processor to perform: (a) receiving a selection of a data tag associated with a data stream including a plurality of data points in a time-series at a current tree in the short term storage, wherein the data tag is associated with a sensor in a hydrocarbon production facility; (b) calculating at least one approximation coefficient based on the plurality of data points using a wavelet transform, including calculating a highest level approximation coefficient; (c) calculating an estimated value based on the highest level approximation coefficient; (d) calculating differences between the estimated value and the plurality of data points of the short term storage; (e) comparing whether a maximum difference among the calculated differences is less than a predetermined threshold, wherein the predetermined threshold is based on accuracy of the sensor; and (f) based on the maximum difference being greater than or equal to the predetermined threshold, preparing a compressed data set by storing the oldest data point in the time-series of the short terra storage in the long terra storage, discarding the oldest half of the data points in the time-series and coefficients from the short term storage, and retaining the newest half of the data points in the short term storage; and receiving one or more new data points into a new tree and repeating steps (b)-(e); (g) based on the maximum difference being less than the predetermined threshold, determining whether a tree size of the current tree is less than a preset maximum tree size; (g)(1) if the tree size of the current tree is less than the preset maximum tree size, receiving one or more new data points into a new tree and repeating steps (b)-(e), and (g)(2) if the tree size of the current tree is equal to the preset maximum tree size, preparing the compressed data set by storing the oldest data point in the time-series of the short term storage in the long term storage and discarding all coefficients and all data points in the current tree in the short term storage; and receiving one or more new data points into a new tree and repeating steps (b)-(e).

12. The system of claim 11, wherein the predetermined threshold is based on accuracy of a source of the plurality of data points, wherein the source is the sensor.

13. The system of claim 11, wherein the plurality of data points represents output of the sensor associated with an industrial process.

14. The system of claim 13, wherein the industrial process comprises a hydrocarbon production process in operation at the hydrocarbon production facility.

15. The system of claim 1, wherein the plurality of data points in step (a) is two data points and the highest level approximation coefficient in step (b) is a first level approximation coefficient.

16. The system of claim 1, wherein the plurality of data points in step (a) is four data points and the highest level approximation coefficient in step (b) is a second level approximation coefficient.

17. The system of claim 1, wherein the plurality of data points in step (a) is eight data points and the highest level approximation coefficient in step (b) is a third level approximation coefficient.

* * * * *